United States Patent
Cho et al.

(10) Patent No.: US 12,108,552 B2
(45) Date of Patent: Oct. 1, 2024

(54) ELECTRONIC DEVICE INCLUDING FLEXIBLE DISPLAY

(71) Applicant: Samsung Electronics Co., Ltd., Suwon-si (KR)

(72) Inventors: Joongyeon Cho, Suwon-si (KR); Taekyung Lee, Suwon-si (KR); Gisoo Lim, Suwon-si (KR); Byunghun Cho, Suwon-si (KR); Bongsuk Choi, Suwon-si (KR); Jongchul Choi, Suwon-si (KR); Changryong Heo, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 18/151,551

(22) Filed: Jan. 9, 2023

(65) Prior Publication Data

US 2023/0156945 A1    May 18, 2023

Related U.S. Application Data

(63) Continuation of application No. 17/158,966, filed on Jan. 26, 2021, now Pat. No. 11,553,614.

(30) Foreign Application Priority Data

May 7, 2020    (KR) .................. 10-2020-0054347

(51) Int. Cl.
*H05K 5/02* (2006.01)
*G06F 1/16* (2006.01)
*H04M 1/02* (2006.01)

(52) U.S. Cl.
CPC ......... *H05K 5/0226* (2013.01); *G06F 1/1652* (2013.01); *H04M 1/0268* (2013.01)

(58) Field of Classification Search
CPC .................................................. G06F 1/1652
See application file for complete search history.

(56) References Cited

U.S. PATENT DOCUMENTS 9,560,750 B2 *   1/2017   Lee .................. G06F 1/1652
9,733,672 B2 *   8/2017   Kim .................. G06F 1/1652
(Continued)

FOREIGN PATENT DOCUMENTS

EP    02919226 A1    9/2015
EP    03261084 A1    12/2017
(Continued)

OTHER PUBLICATIONS

Office Action dated Feb. 1, 2021 in connection with Korean Patent Application No. 10-2020-0054347, 12 pages.
(Continued)

*Primary Examiner* — Rockshana D Chowdhury
*Assistant Examiner* — Douglas R Burtner

(57)    ABSTRACT

An electronic device comprises a first structure including a first plate providing a first surface and a second surface and a second structure coupled to surround at least a portion of the first structure and configured to guide the first structure in a direction parallel with the first surface or the second surface. The device also includes a roller mounted on an edge of the second structure and a flexible display including a first area mounted on the first surface and a second area extending from the first area. The device also includes at least one support sheet mounted on the roller and wound around the roller as the roller rotates. The support sheet is wound around the roller when the second area is received inside the second structure, and is unfolded inside the second area when the second area is exposed to the outside of the second structure.

20 Claims, 14 Drawing Sheets

(56) References Cited

U.S. PATENT DOCUMENTS

| | | | |
|---|---|---|---|
| 9,817,443 B2* | 11/2017 | Kim | G06F 1/1652 |
| 9,844,152 B2* | 12/2017 | Heo | H05K 1/028 |
| 10,203,531 B2* | 2/2019 | Choi | H10K 50/131 |
| 10,534,402 B1* | 1/2020 | Kim | H05K 1/118 |
| 10,893,130 B1* | 1/2021 | Song | H04M 1/0237 |
| 11,127,323 B2* | 9/2021 | Kim | G06F 1/1652 |
| 11,140,790 B2* | 10/2021 | Kim | H05K 5/03 |
| 11,170,671 B1* | 11/2021 | Han | G09F 9/301 |
| 11,194,363 B2* | 12/2021 | Kim | G06F 1/1626 |
| 2011/0043976 A1* | 2/2011 | Visser | G09F 9/301 |
| | | | 361/679.01 |
| 2012/0168009 A1* | 7/2012 | Chen | G09F 9/301 |
| | | | 156/247 |
| 2012/0204453 A1* | 8/2012 | Jung | G09F 9/301 |
| | | | 40/517 |
| 2013/0058063 A1* | 3/2013 | O'Brien | G06F 1/1624 |
| | | | 361/807 |
| 2013/0201208 A1 | 8/2013 | Cho et al. | |
| 2013/0234951 A1 | 9/2013 | Kim et al. | |
| 2014/0028596 A1 | 1/2014 | Seo et al. | |
| 2014/0211399 A1* | 7/2014 | O'Brien | G06F 1/1652 |
| | | | 29/592.1 |
| 2014/0320393 A1 | 10/2014 | Modarres et al. | |
| 2016/0033999 A1 | 2/2016 | Browning | |
| 2016/0054758 A1* | 2/2016 | Han | G06F 1/1652 |
| | | | 361/679.26 |
| 2016/0100478 A1* | 4/2016 | Lee | G06F 1/1624 |
| | | | 361/749 |
| 2016/0116944 A1* | 4/2016 | Lee | G06F 1/1681 |
| | | | 361/679.26 |
| 2016/0212837 A1 | 7/2016 | Kim | |
| 2016/0259514 A1 | 9/2016 | Sang et al. | |
| 2016/0363960 A1* | 12/2016 | Park | G09F 15/0062 |
| 2016/0381814 A1* | 12/2016 | Wang | H05K 7/1401 |
| | | | 361/807 |
| 2017/0140504 A1 | 5/2017 | Jeong et al. | |
| 2017/0156219 A1* | 6/2017 | Heo | G06F 1/1679 |
| 2017/0188471 A1* | 6/2017 | Fan | G09F 9/301 |
| 2017/0196103 A1* | 7/2017 | Cho | H04M 1/0268 |
| 2017/0199712 A1 | 7/2017 | Lee | |
| 2017/0212607 A1 | 7/2017 | Yoon | |
| 2018/0120954 A1 | 5/2018 | Seo et al. | |
| 2018/0375054 A1 | 12/2018 | Wang et al. | |
| 2019/0064882 A1* | 2/2019 | Xia | A44C 5/00 |
| 2019/0098776 A1 | 3/2019 | Jeon | |
| 2019/0141843 A1* | 5/2019 | Park | H05K 1/189 |
| 2019/0261519 A1 | 8/2019 | Park et al. | |
| 2020/0029451 A1* | 1/2020 | Ran | H05K 5/0086 |
| 2020/0249722 A1* | 8/2020 | Cha | G06F 1/1681 |
| 2020/0253069 A1* | 8/2020 | Cha | G06F 1/1681 |
| 2020/0264660 A1* | 8/2020 | Song | G06F 1/1624 |
| 2020/0267246 A1* | 8/2020 | Song | H05K 1/148 |
| 2021/0056872 A1* | 2/2021 | Kwon | H05K 1/189 |
| 2021/0135492 A1 | 5/2021 | Kim et al. | |
| 2022/0253104 A1* | 8/2022 | Luo | G06F 1/1652 |

FOREIGN PATENT DOCUMENTS

| | | |
|---|---|---|
| JP | 2018-088264 A | 6/2018 |
| JP | 2019-526818 A | 9/2019 |
| KR | 10-2012-0093665 A | 8/2012 |
| KR | 10-2014-0016082 A | 2/2014 |
| KR | 10-2014-0059274 A | 5/2014 |
| KR | 10-2016-0022434 A | 3/2016 |
| KR | 10-2016-0108705 A | 9/2016 |
| KR | 10-2017-0019043 A | 2/2017 |
| KR | 10-2017-0089664 A | 8/2017 |
| KR | 10-2017-0136951 A | 12/2017 |
| KR | 10-2019-0036978 A | 4/2019 |
| KR | 10-2019-0101184 A | 8/2019 |
| KR | 10-2019-0115888 A | 10/2019 |
| KR | 10-2019-0124009 A | 11/2019 |
| KR | 10-2020-0013549 A | 2/2020 |
| KR | 10-2020-0041846 A | 4/2020 |
| WO | WO-2021149851 A1 * | 7/2021 |

OTHER PUBLICATIONS

Korean Intellectual Property Office, "Decision on Grant" dated Aug. 12, 2021, in connection with Korean Patent Application No. 10-2020-0054347, 7 pages.

International Search Report and Written Opinion for International Application No. PCT/KR2019/007166, mailed on Nov. 28, 2019 (10 pages).

European Search Report for European Application No. 19819118.1, mailed on Mar. 18, 2021 (10 pages).

U.S. Office Action for U.S. Appl. No. 16/440,493, mailed on May 26, 2020 (42 pages).

U.S. Office Action for U.S. Appl. No. 17/160,856, mailed on Nov. 23, 2021 (20 pages).

Korean Office Action for Korean Application No. 10-2018-0068398, mailed on Mar. 8, 2021 (3 pages).

International Search Report and Written Opinion of the International Searching Authority in connection with International Application No. PCT/KR2021/000526 issued Apr. 19, 2021, 8 pages.

Supplementary European Search Report dated Jun. 23, 2023, in connection with European Patent Application No. 21799926.7, 10 pages.

* cited by examiner

ELECTRONIC DEVICE INCLUDING FLEXIBLE DISPLAY

CROSS-REFERENCE TO RELATED APPLICATION

This application is a continuation of U.S. patent application Ser. No. 17/158,966 filed on Jan. 26, 2021, which is based on and claims priority under 35 U.S.C. 119 to Korean Patent Application No. 10-2020-0054347 filed on May 7, 2020, in the Korean Intellectual Property Office, the disclosures of which are herein incorporated by reference in their entirety.

BACKGROUND

1. Field

Various embodiments of the disclosure relate to an electronic device, e.g., an electronic device with a flexible display.

2. Description of Related Art

As the demand for mobile communication increases, or as the degree of integration of electronic devices increases, the portability of electronic devices such as mobile communication terminals may be increased, and better convenience may be provided in use of multimedia functions. For example, as touchscreen-integrated displays replace traditional mechanical (button-type) keypads, electronic devices may come more compact while functioning as an input device. For example, as the mechanical keypad may be omitted from the electronic device, portability of the electronic device may be improved. As the display area may be expanded to the area which used to be occupied by the mechanical keypad, the electronic device may provide a larger screen while remaining in the same size and weight as when it has the mechanical keypad.

Use of an electronic device with a larger screen may give more convenience in, e.g., web browsing or multimedia playing. A larger display may be adopted to output a larger screen. However, this way may be limited by the portability of the electronic device. According to an embodiment, a display using organic light emitting diodes may secure the portability of the electronic device while providing a larger screen. For example, a display using, or equipped with, organic light emitting diodes may implement a stable operation even if it is made quite thin, so that the display may be applied to an electronic device in a foldable, bendable or rollable form.

Electronic devices which may be folded or rolled according to the relative motion of mechanical structures may suffer from influx of foreign bodies into the internal space through the gap between the mechanical structures. For example, the foreign bodies may contaminate the internal space of the foldable, or rollable, electronic device or damage various electronic or mechanical components.

A foldable or rollable electronic device may include a flexible display. The flexible display may be attached to a mechanical structure and may be protected by a transparent member, such as a glass plate, a glass cover, a glass film, or a polyimide film, if necessary. In a structure in which the flexible display is attached to a mechanical structure in a foldable or rollable electronic device, the flexible display may be peeled off from the mechanical structure. For example, as the adhesive (or adhesive member) in the electronic device may denature or deteriorate according to the actual use environment or use time, the flexible display may start peeling off from a portion, e.g., edge or corner, thereof.

SUMMARY

According to various embodiments, there may be provided an electronic device including a flexible display, which may block entry of foreign bodies into the internal space.

According to various embodiments, there may be provided an electronic device including a flexible display, which may block entry of foreign bodies while allowing the flexible display to be folded or rolled more smoothly.

According to various embodiments, there may be provided an electronic device including a flexible display, which may prevent the flexible display from separating off the mechanical structure and secure durability.

In accordance with an embodiment, an electronic device comprises a first structure including a first plate providing a first surface and a second surface facing away from the first surface, a second structure coupled to surround at least a portion of the first structure and guiding a sliding of the first structure in a direction parallel with the first surface or the second surface of the first structure, a roller rotatably mounted on an edge of the second structure, a flexible display including a first area mounted on the first surface of the first structure and a second area extending from the first area, the second area of the flexible display guided at least partially by the roller to be inserted or received from a side of the second structure to an inside of the second structure or exposed to an outside of the second structure as the first structure is slid, and at least one support sheet mounted on the roller and selectively wound around the roller as the roller rotates, wherein the support sheet is wound around the roller when the second area is received inside the second structure, and is unfolded inside the second area when the second area is exposed to the outside of the second structure.

In accordance with an embodiment, an electronic device may comprise a housing including a rear case and a side wall extending from the rear case, a roller rotatably mounted in the housing while being positioned adjacent to a portion of the side wall, at least one support sheet mounted on the roller and selectively wound around the roller as the roller rotates, and a flexible display including a first area exposed to an outside of the housing and a second area extending from the first area, the second area of the flexible display guided by the roller to be at least partially inserted or received inside the housing or exposed to the outside of the housing, wherein the support sheet is gradually wound around the roller as the second area is gradually received inside the housing, and wherein when the second area is exposed to the outside of the housing, the support sheet is positioned between the rear case and the second area.

According to various embodiments, the electronic device may include a support member (e.g., support sheet) wound around the roller, thereby allowing for adjustment of the gap (e.g., the gap of the entrance) of the portion where the flexible display enters the second structure or the housing. For example, the entrance gap may be reduced, with the flexible display received in the second structure or housing, so that entry of foreign bodies may be blocked off. According to an embodiment, a sufficient gap may be secured between the flexible display and other structures while inserted to or extracted from the second structure or housing, thus preventing the display from interfering with or rubbing against other structures. By preventing the flexible display from interfering with or rubbing against other structures, the insertion or extraction operation may be smoothed, and damage to the flexible display may be prevented. According to an embodiment, at least some of the edges of the flexible display may be supported on the inside of the mechanical structure, thereby preventing separation from the mechanical structure due to degeneration of the adhesive component (or adhesive member).

Before undertaking the DETAILED DESCRIPTION below, it may be advantageous to set forth definitions of certain words and phrases used throughout this patent document: the terms "include" and "comprise," as well as derivatives thereof, mean inclusion without limitation; the term "or," is inclusive, meaning and/or; the phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like; and the term "controller" means any device, system or part thereof that controls at least one operation, such a device may be implemented in hardware, firmware or software, or some combination of at least two of the same. It should be noted that the functionality associated with any particular controller may be centralized or distributed, whether locally or remotely.

Moreover, various functions described below can be implemented or supported by one or more computer programs, each of which is formed from computer readable program code and embodied in a computer readable medium. The terms "application" and "program" refer to one or more computer programs, software components, sets of instructions, procedures, functions, objects, classes, instances, related data, or a portion thereof adapted for implementation in a suitable computer readable program code. The phrase "computer readable program code" includes any type of computer code, including source code, object code, and executable code. The phrase "computer readable medium" includes any type of medium capable of being accessed by a computer, such as read only memory (ROM), random access memory (RAM), a hard disk drive, a compact disc (CD), a digital video disc (DVD), or any other type of memory. A "non-transitory" computer readable medium excludes wired, wireless, optical, or other communication links that transport transitory electrical or other signals. A non-transitory computer readable medium includes media where data can be permanently stored and media where data can be stored and later overwritten, such as a rewritable optical disc or an erasable memory device.

Definitions for certain words and phrases are provided throughout this patent document, those of ordinary skill in the art should understand that in many, if not most instances, such definitions apply to prior, as well as future uses of such defined words and phrases.

BRIEF DESCRIPTION OF THE DRAWINGS

For a more complete understanding of the present disclosure and its advantages, reference is now made to the following description taken in conjunction with the accompanying drawings, in which like reference numerals represent like parts.

Throughout the drawings, like reference numerals will be understood to refer to like parts, components, and structures.

DETAILED DESCRIPTION

Figure 1:
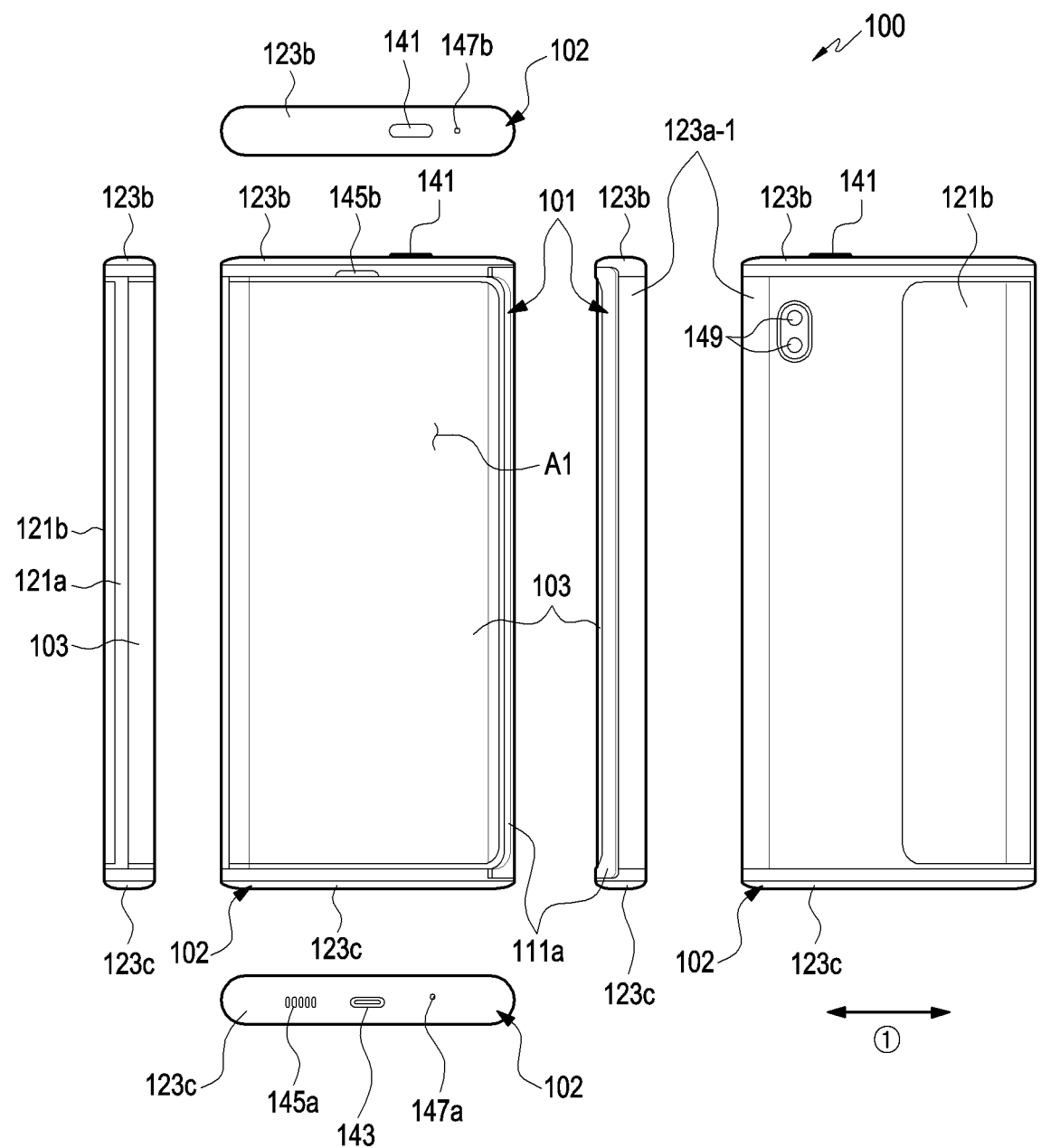
FIG. 1 is a view illustrating an electronic device according to an embodiment, wherein a portion of a flexible display is received in a second structure.

FIGS. 1 through 22, discussed below, and the various embodiments used to describe the principles of the present disclosure in this patent document are by way of illustration only and should not be construed in any way to limit the scope of the disclosure. Those skilled in the art will understand that the principles of the present disclosure may be implemented in any suitably arranged system or device.

It should be appreciated that various embodiments of the disclosure and the terms used therein are not intended to limit the technological features set forth herein to particular embodiments and include various changes, equivalents, or replacements for a corresponding embodiment. With regard to the description of the drawings, similar reference numerals may be used to refer to similar or related elements. It is to be understood that a singular form of a noun corresponding to an item may include one or more of the things, unless the relevant context clearly indicates otherwise. As used herein, each of such phrases as "A or B," "at least one of A and B," "at least one of A or B," "A, B, or C," "at least one of A, B, and C," and "at least one of A, B, or C," may include any one of, or all possible combinations of the items enumerated together in a corresponding one of the phrases. As used herein, such terms as "1st" and "2nd," or "first" and "second" may be used to simply distinguish a corresponding component from another, and does not limit the components in other aspect (e.g., importance or order). It is to be understood that if an element (e.g., a first element) is referred to, with or without the term "operatively" or "communicatively", as "coupled with," "coupled to," "connected with," or "connected to" another element (e.g., a second element), it means that the element may be coupled with the other element directly (e.g., wiredly), wirelessly, or via a third element.

As used herein, the term "module" may include a unit implemented in hardware, software, or firmware, and may interchangeably be used with other terms, for example, "logic," "logic block," "part," or "circuitry". A module may be a single integral component, or a reduced (minimum) unit or part thereof, adapted to perform one or more functions. For example, according to an embodiment, the module may be implemented in a form of an application-specific integrated circuit (ASIC).

Various embodiments as set forth herein may be implemented as software (e.g., a program) including one or more instructions that are stored in a storage medium (e.g., internal memory or external memory) that is readable by a machine (e.g., the electronic device #01). For example, a processor of the machine (e.g., the electronic device 100) may invoke at least one of the one or more instructions stored in the storage medium, and execute it, with or without using one or more other components under the control of the processor. This allows the machine to be operated to perform at least one function according to the at least one instruction invoked. The one or more instructions may include a code generated by a complier or a code executable by an interpreter. The machine-readable storage medium may be provided in the form of a non-transitory storage medium. Wherein, the term "non-transitory" simply means that the storage medium is a tangible device, and does not include a signal (e.g., an electromagnetic wave), but this term does not differentiate between where data is semi-permanently stored in the storage medium and where the data is temporarily stored in the storage medium.

According to an embodiment, a method may be included and provided in a computer program product. The computer program product may be traded as a product between a seller and a buyer. The computer program product may be distributed in the form of a machine-readable storage medium (e.g., compact disc read only memory (CD-ROM)), or be distributed (e.g., downloaded or uploaded) online via an application store (e.g., PLAYSTORE), or between two user devices (e.g., smart phones) directly. If distributed online, at least part of the computer program product may be temporarily generated or at least temporarily stored in the machine-readable storage medium, such as memory of the manufacturer's server, a server of the application store, or a relay server.

According to an embodiment, each component (e.g., a module or a program) of the above-described components may include a single entity or multiple entities. According to an embodiment, one or more of the above-described components may be omitted, or one or more other components may be added. Alternatively or additionally, a plurality of components (e.g., modules or programs) may be integrated into a single component. According to an embodiment, the integrated component may still perform one or more functions of each of the plurality of components in the same or similar manner as they are performed by a corresponding one of the plurality of components before the integration. According to an embodiment, operations performed by the module, the program, or another component may be carried out sequentially, in parallel, repeatedly, or heuristically, or one or more of the operations may be executed in a different order or omitted, or one or more other operations may be added.

Figure 2:
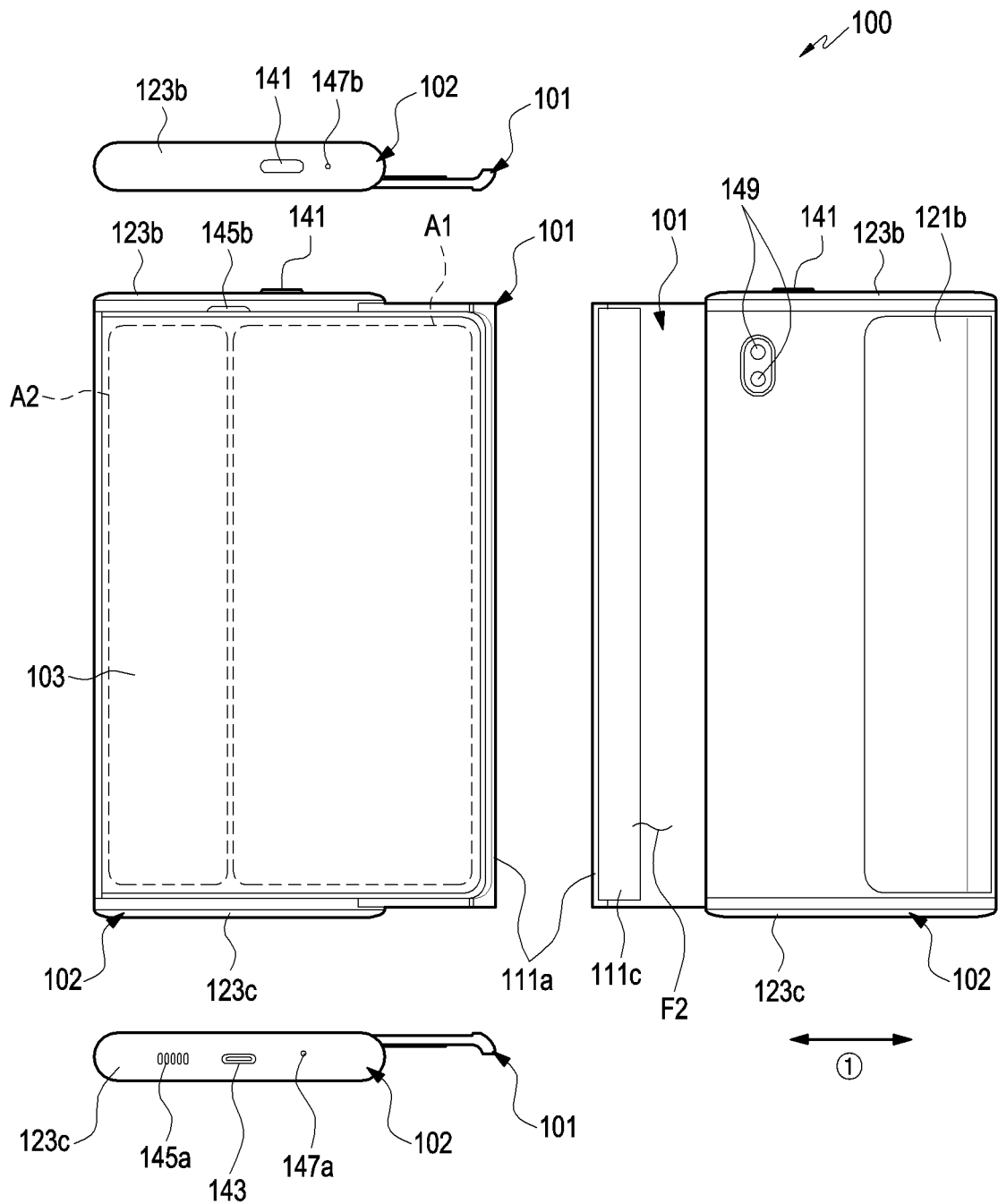
FIG. 2 is a view illustrating an electronic device according to an embodiment, wherein most of a flexible display is exposed to the outside of a second structure.

FIG. 1 is a view illustrating an electronic device 100 according to an embodiment, wherein a portion (e.g., the second area A2) of a flexible display 103 is received in a second structure 102. FIG. 2 is a view illustrating an electronic device 100 according to an embodiment, wherein most of a flexible display 103 is exposed to the outside of a second structure 102.

The state shown in FIG. 1 may be defined as a first structure 101 being closed with respect to a second structure 102, and the state shown in FIG. 2 may be defined as the first structure 101 being open with respect to the second structure 102. According to an embodiment, the "closed state" or "opened state" may be defined as a closed or open state of the electronic device.

Referring to FIGS. 1 and 2, an electronic device 100 may include a first structure 101 and a second structure 102 disposed to be movable in the first structure 101. According to an embodiment, the electronic device 100 may be interpreted as having a structure in which the first structure 101 is slidably disposed on the second structure 102. According to an embodiment, the first structure 101 may be disposed to perform reciprocating motion by a predetermined distance in a predetermined direction with respect to the second structure 102, for example, a direction indicated by an arrow ①.

According to an embodiment, the first structure 101 may be referred to as, for example, a first housing, a slide unit, or a slide housing, and may be disposed to reciprocate on the second structure 102. According to an embodiment, the second structure 102 may be referred to as, for example, a second housing, a main part, or a main housing, and may receive various electric or electronic components such as a main circuit board or a battery. A portion (e.g., the first area A1) of the display 103 may be seated on the first structure 101. According to an embodiment, another portion (e.g., the second area A2) of the display 103 may be received (e.g., slide-in) into the inside of the second structure 102 or exposed (e.g., slide-out) to the outside of the second structure 102 as the first structure 101 moves (e.g., slides) relative to the second structure 102.

According to an embodiment, the first structure 101 may include a first plate 111a (e.g., a slide plate), and the first structure 101 may include a first surface F1 (refer to FIG. 3) formed to at least a portion of the first plate 111a and a second surface F2 facing away from the first surface F1. According to an embodiment, the second structure 102 may include a second plate 121a (refer to FIG. 3) (e.g., a rear case), a first side wall 123a extending from the second plate 121a, a second side wall 123b extending from the first side wall and the second plate 121a, a third side wall 123c extending from the first side wall 123a and the second plate 121a and positioned parallel to the second side wall 123b, and/or a rear plate 121b (e.g., a rear window). According to an embodiment, the second side wall 123b and the third side wall 123c may be formed to be perpendicular to the first side wall 123a. According to an embodiment, the second plate 121a, the first side wall 123a, the second side wall 123b, and the third side wall 123c may be formed to have an opening (e.g., in the front face) to receive (or surround) at least a portion of the first structure 101. For example, the first structure 101 may be coupled to the second structure 102 in a state in which it is at least partially surrounded, and the first structure 101 may be slide in a direction parallel to the first surface F1 or the second surface F2, for example, direction ① indicated with the arrow.

According to an embodiment, the second side wall 123b or the third side wall 123c may be omitted. According to an embodiment, the second plate 121a, the first side wall 123a, the second side wall 123b, and/or the third side wall 123c may be formed as separate structures and may be combined or assembled. The rear plate 121b may be coupled to surround at least a portion of the second plate 121a. According to an embodiment, the rear plate 121b may be formed substantially integrally with the second plate 121a. According to an embodiment, the second plate 121a or the rear plate 121b may cover at least a portion of the flexible display 103. For example, the flexible display 103 may be at least partially received inside the second structure 102, and the second plate 121a or the rear plate 121b may cover the portion of the flexible display received inside the second structure 102.

According to an embodiment, the first structure 101 may be moved in an open state or closed state with respect to the second structure 102 in a first direction (e.g., direction ①) parallel with the second plate 121a (e.g., the rear case) and the second side wall 123b to be positioned a first distance away from the first side wall 123a in the closed state and be positioned a second distance away from the first side wall 123a in the open state, wherein the second distance is larger than the first distance. According to an embodiment, when in the closed state, the first structure 101 may be positioned to surround a portion of the first side wall 123a.

According to an embodiment, the electronic device 100 may include a display 103, a key input device 141, a connector hole 143, audio holes 145a, 145b, 147a, and 147b, or a camera module 149. Although not shown, the electronic device 100 may further include an indicator (e.g., a light emitting diode (LED) device) or various sensor modules.

According to an embodiment, the display 103 may include a first area A1 and a second area A2. According to an embodiment, the first area A1 may extend substantially across at least a portion of the first surface F1 and may be disposed on the first surface F1. The second area A2 may extend from the first area A1 and be inserted or received into the inside of the second structure 102 (e.g., housing) or be exposed to the outside of the structure 102 as the first structure 101 slides. As will be described below, the second area A2 may be moved while being substantially guided by a roller 151 (refer to FIG. 3) mounted on the second structure 102 and may thus be received into the inside of or exposed to the outside of the second structure 102. For example, while the first structure 101 slides, a portion of the second area A2 may be deformed into a curved shape in a position corresponding to the roller 151.

According to an embodiment, when viewed from the top of the first plate 111a (e.g., slide plate), when the first structure 101 moves from the closed state to the open state, the second area A2 may be gradually exposed to the outside of the second structure 102 to be substantially coplanar with the first area A1. The display 103 may be disposed to be coupled with, or adjacent, a touch detecting circuit, a pressure sensor capable of measuring the strength (pressure) of touches, and/or a digitizer for detecting a magnetic field-type stylus pen. According to an embodiment, the second area A2 may be at least partially received inside the second structure 102, and a portion of the second area A2 may be exposed to the outside even in the state shown in FIG. 1 (e.g., the closed state). According to an embodiment, irrespective of the closed state or the open state, the exposed portion of the second area A2 may be positioned on the roller 151 and, in a position corresponding to the roller 151, a portion of the second area A2 may maintain the curved shape.

The key input device 141 may be disposed on the second side wall 123b or the third side wall 123c of the second structure 102. Depending on the appearance and the state of use, the electronic device 100 may be designed to omit the illustrated key input device 141 or to include additional key input device(s). According to an embodiment, the electronic device 100 may include a key input device (not shown), e.g., a home key button or a touchpad disposed around the home key button. According to an embodiment, at least a portion of the key input device 141 may be positioned on an area of the first structure 101.

According to an embodiment, the connector hole 143 may be omitted or may receive a connector (e.g., a universal serial bus (USB) connector) for transmitting and receiving power and/or data with an external electronic device. Although not shown, the electronic device 100 may include a plurality of connector holes 143, and some of the plurality of connector holes 143 may function as connector holes for transmitting/receiving audio signals with an external electronic device. In the illustrated embodiment, the connector hole 143 is disposed on the third side wall 123c, but the disclosure is not limited thereto. For example, the connector hole 143 or a connector hole not shown may be disposed on the first side wall 123a or the second side wall 123b.

According to an embodiment, the audio holes 145a, 145b, 147a, and 147b may include speaker holes 145a and 145b or microphone holes 147a and 147b. One of the speaker holes 145a and 145b may be provided as a receiver hole for voice calls, and the other may be provided as an external speaker hole. The microphone holes 147a and 147b may have a microphone inside to obtain external sounds. According to an embodiment, there may be a plurality of microphones to be able to detect the direction of a sound. According to an embodiment, the speaker holes 145a and 145b and the microphone holes 147a and 147b may be implemented as one hole, or a speaker may be included without the speaker holes 145a and 145b (e.g., a piezo speaker). According to, the speaker hole indicated by the reference number "145b" may be disposed in the first structure 101 and used as a receiver hole for voice calls, and the speaker hole indicated by the reference number "145a" (e.g., an external speaker hole) or the microphone holes 147a and 147b may be disposed in the second structure 102 (e.g., one of the side walls 123a, 123b, and 123c).

The camera module 149 may be provided on the second structure 102 and may capture a subject in a direction opposite to the first area A1 of the display 103. The electronic device 100 may include a plurality of camera modules 149. For example, the electronic device 100 may include a wide-angle camera, a telephoto camera, or a close-up camera, and according to an embodiment, by including an infrared projector and/or an infrared receiver, the electronic device 100 may measure the distance to the subject. The camera module 149 may include one or more lenses, an image sensor, and/or an image signal processor. Although not shown, the electronic device 100 may further include a camera module (e.g., a front camera) that captures the subject in a direction opposite to the first area A1 of the display 103. For example, the front camera may be disposed around the first area A1 or in an area overlapping the display 103 and, when disposed in the area overlapping the display 103, the front camera may capture the subject via the display 103.

According to an embodiment, an indicator (not shown) of the electronic device 100 may be disposed on the first structure 101 or the second structure 102, and the indicator may include a light emitting diode to provide state information about the electronic device 100 as a visual signal. The sensor module (not shown) of the electronic device 100 may produce an electrical signal or data value corresponding to the internal operation state or external environment state of the electronic device. The sensor module may include, for example, a proximity sensor, a fingerprint sensor, or a biometric sensor (e.g., an iris/face recognition sensor or a heartrate monitor (HRM) sensor). According to an embodiment, the sensor module may further include, e.g., at least one of a gesture sensor, a gyro sensor, an atmospheric pressure sensor, a magnetic sensor, an acceleration sensor, a grip sensor, a color sensor, an infrared (IR) sensor, a temperature sensor, a humidity sensor, or an illuminance sensor.

Figure 3:
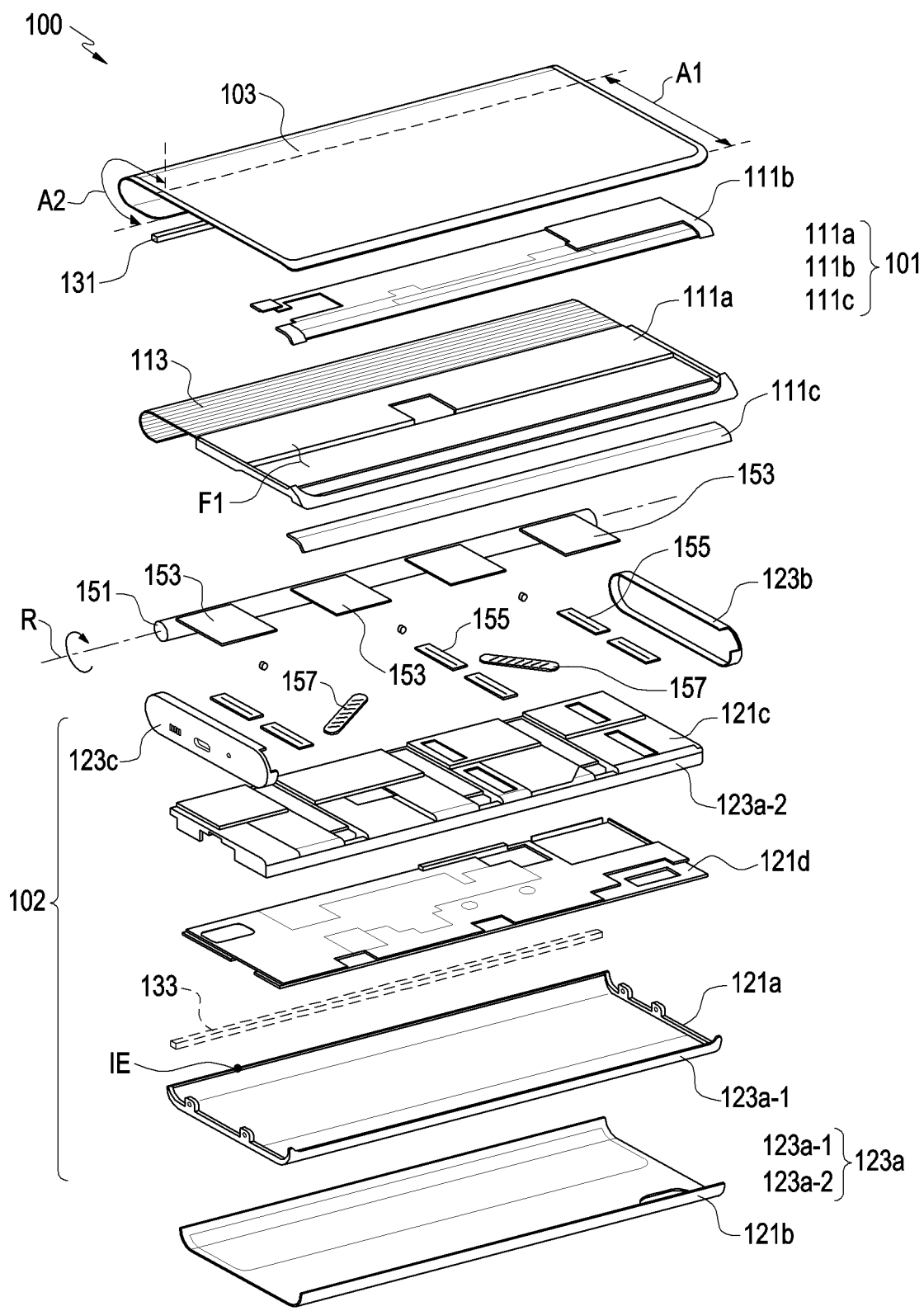
FIG. 3 is an exploded perspective view illustrating an electronic device according to an embodiment.

FIG. 3 is an exploded perspective view illustrating an electronic device (e.g., the electronic device 100 of FIG. 1 or 2) according to an embodiment.

Referring to FIG. 3, the electronic device 100 may include a first structure 101, a second structure 102 (e.g., a housing), a display 103 (e.g., a flexible display), a guide member (e.g., the roller 151), a support sheet 153, and/or a multi-joint hinge structure 113. A portion (e.g., the second area A2) of the display 103 may be received in the second structure 102 while being guided by the roller 151.

According to an embodiment, the first structure 101 may include a first plate 111a (e.g., a slide plate), a first bracket 111b and/or a second bracket 111c mounted on the first plate 111a. The first structure 101, for example, the first plate 111a, the first bracket 111b, and/or the second bracket 111c may be formed of a metallic material and/or a non-metallic (e.g., polymer) material. The first plate 111a may be mounted on the second structure 102 (e.g., the housing) and may be linearly reciprocated in one direction (e.g., in the direction ① indicated with the arrow in FIG. 1) while being guided by the second structure 102. According to an embodiment, the first bracket 111b may be coupled to the first plate 111a to, together with the first plate 111a, form the first surface F1 of the first structure 101. The first area A1 of the display 103 may be substantially mounted on the first surface F1 and remain in a flat plate shape. The second bracket 111c may be coupled to the first plate 111a to, together with the first plate 111a, form the second surface F2 of the first structure 101. According to an embodiment, the first bracket 111b and/or the second bracket 111c may be integrally formed with the first plate 111a. This may be appropriately designed in consideration of the assembly structure or manufacturing process of the product to be manufactured. The first structure 101 or the first plate 111a may be coupled with the second structure 102 and slide with respect to the second structure 102.

According to an embodiment, the multi-joint hinge structure 113 may include a plurality of bars or rods 114 (refer to FIG. 16 or FIG. 17) and may be connected to one end of the first structure 101. For example, as the first structure 101 slides, the multi joint hinge structure 113 may move with respect to the second structure 102 and, in a closed state (e.g., the state shown in FIG. 1), the multi-joint hinge structure 113 may be substantially received inside the second structure 102. According to an embodiment, even in the closed state, a portion of the multi-joint hinge structure 113 may not be received inside the second structure 102. For example, even in the closed state, a portion of the multi joint hinge structure 113 may be positioned to correspond to the roller 151 outside the second structure 102. The plurality of rods 114 may extend in a straight line and be disposed parallel to the rotation axis R of the roller 151, and the plurality of rods 114 may be arranged along a direction perpendicular to the rotation axis R, e.g., the direction along which the first structure 101 slides.

According to an embodiment, each rod 114 may pivot around another adjacent rod 114 while remaining parallel with the other adjacent rod 114. Accordingly, as the first structure 101 slides, the plurality of rods 114 may be arranged to form a curved shape or a planar shape. For example, as the first structure 101 slides, a portion of the multi-joint hinge structure 113, which faces the roller 151, may form a curved surface, and another portion of the multi-joint hinge structure 113, which does not face the roller 151, may form a flat surface. According to an embodiment, the second area A2 of the display 103 may be mounted or supported on the multi-joint hinge structure 113 and, in the open state (e.g., the state shown in FIG. 2), the second area A2, along with the first area A1, may be exposed to the outside of the second structure 102. In the state in which the second area A2 is exposed to the outside of the second structure 102, the multi-joint hinge structure 113 may substantially form a flat surface, thereby supporting or maintaining the second area A2 in the flat state.

According to an embodiment, the second structure 102 (e.g., housing) may include a second plate 121a (e.g., a rear case), a printed circuit board (not shown), a rear plate 121b, a third plate 121c (e.g., the front case), and a support member 121d. The second plate 121a, e.g., the rear case, may be disposed to face in a direction opposite to the first surface F1 of the first plate 111a, and the second plate 121a may substantially form the external shape of the second structure 102 or the electronic device 100. According to an embodiment, the second structure 102 may include a first side wall 123a extending from the second plate 121a, a second side wall 123b extending from the second plate 121a and formed to be substantially perpendicular to the first side wall 123a, and a third side wall 123c extending from the second plate 121a, substantially perpendicular to the first side wall 123a, and parallel to the second side wall 123b. In the illustrated embodiment, the second side wall 123b and the third side wall 123c are manufactured as separate components from the second plate 121a and are mounted or assembled on the second plate 121a. However, the second side wall 123b and the third side wall 123c may alternatively be integrally formed with the second plate 121a. The second structure 102 may receive an antenna for proximity wireless communication, an antenna for wireless charging, or an antenna for magnetic secure transmission (MST) in a space that does not overlap the multi-joint hinge structure 113.

According to an embodiment, the rear plate 121b may be coupled to the outer surface of the second plate 121a and, according to an embodiment, the rear plate 121b may be manufactured integrally with the second plate 121a. According to an embodiment, the second plate 121a may be formed of a metal or polymer, and the rear plate 121b may be formed of a material such as metal, glass, synthetic resin, or ceramic to decorate the exterior of the electronic device 100. According to an embodiment, the second plate 121a and/or the rear plate 121b may be formed of a material that transmits light at least partially (e.g., an auxiliary display area). For example, while a portion (e.g., the second area A2) of the display 103 is received in the second structure 102, the electronic device 100 may output visual information using a partial area of the display 103 received inside the second structure 102. The auxiliary display area may provide the visual information output from the area received inside the second structure 102 to the outside of the second structure 102.

According to an embodiment, the third plate 121c may be formed of a metal or polymer, and the third plate 121c may be coupled with the second plate 121a (e.g., rear case), the first side wall 123a, the second side wall 123b, and/or the third side wall 123c to form an internal space of the second structure 102. According to an embodiment, the third plate 121c may be referred to as a "front case", and the first structure 101, e.g., the first plate 111a, may be slid while substantially facing the third plate 121c. According to an embodiment, the first side wall 123a may be formed of a combination of a first side wall portion 123a-1 extending from the second plate 121a and a second side wall portion 123a-2 formed at an edge of the third plate 121c. According to an embodiment, the first side wall portion 123a-1 may be coupled to surround an edge of the third plate 121c, e.g., the second side wall portion 123a-2. In this case, the first side wall portion 123a-1 itself may form the first side wall 123a.

According to an embodiment, the support member 121d may be disposed in a space between the second plate 121a and the third plate 121c, and may have a flat plate shape formed of a metal or polymer. The support member 121d may provide an electromagnetic shielding structure in the internal space of the second structure 102 or may increase mechanical rigidity of the second structure 102. According to an embodiment, when received into the inside of the second structure 102, a partial area (e.g., the second area A2) of the multi joint hinge structure 113 and/or the display 103 may be positioned in a space between the second plate 121a and the support member 121d.

According to an embodiment, a printed circuit board (not shown) may be disposed in a space between the third plate 121c and the support member 121d. For example, the printed circuit board may be received in a space separated by the support member 121d from the space in which a partial area of the multi joint hinge structure 113 and/or the display 103 is received inside the second structure 102. A processor, memory, and/or interface may be mounted on the printed circuit board. The processor may include one or more of, e.g., a central processing unit, an application processor, a graphic processing device, an image signal processing, a sensor hub processor, or a communication processor.

The memory may include, e.g., a volatile or non-volatile memory.

The interface may include, e.g., a high definition multimedia interface (HDMI), a universal serial bus (USB) interface, a secure digital (SD) card interface, and/or an audio interface. The interface may electrically or physically connect, e.g., the electronic device 100 with an external electronic device and may include a USB connector, an SD card/multimedia card (MMC) connector, or an audio connector.

According to an embodiment, the display 103 may be an organic light emitting diode-based flexible display, and the display 103 may normally remain in the flat shape and may be at least partially deformed into a curved shape. According to an embodiment, the first area A1 of the display 103 may be mounted or attached to the first surface F1 of the first structure 101 and maintained in a substantially flat shape. The second area A2 may extend from the first area A1 and may be supported or attached to the multi joint hinge structure 113. For example, the second area A2 may extend along the sliding direction of the first structure 101 and, along with the multi-joint hinge structure, may be received in the second structure 102. As the multi joint hinge structure 113 is deformed, the second area A2 may be at least partially deformed into a curved shape.

According to an embodiment, as the first structure 101 slides on the second structure 102, the area of the display 103 exposed to the outside may vary. The electronic device 100 (e.g., processor) may change the area of the display 103 that is activated based on the area of the display 103 that is exposed to the outside. For example, in the open state or in an intermediate position between the closed state and the open state, the electronic device 100 may activate a partial area exposed to the outside of the second structure 102 of the entire area of the display 103. In the closed state, the electronic device 100 may activate the first area A1 of the display 103 and deactivate the second area A2. In the closed state, when there is no user input for a certain period of time (e.g., 30 seconds or 2 minutes), the electronic device 100 may deactivate the entire area of the display 103. According to an embodiment, in the state in which the entire area of the display 103 is deactivated, the electronic device 100 may activate a partial area of the display 103 as necessary (e.g., a notification according to user settings, missing call/received message notification) and provide visual information through the auxiliary display area (e.g., a portion of the second plate 121a and/or the rear plate 121b formed of a material that transmits light).

According to an embodiment, in the open state (e.g., the state shown in FIG. 2), the entire area (e.g., the first area A1 and the second area A2) of the display 103 may be substantially exposed to the outside, and the first area A1 and the second area A2 may be arranged to form a plane. According to an embodiment, even in the open state, a portion (e.g., one end) of the second area A2 may be positioned corresponding to the roller 151, and the portion of the second area A2, which corresponds to the roller 151 may remain in the curved shape. For example, according to an embodiment, despite the phrase "the second area A2 is disposed to form a plane in the open state," a portion of the second area A2 may remain in the curved shape. Likewise, although it is stated that "in the closed state, the multi-joint hinge structure 113 and/or the second area A2 are received inside the second structure 102," a portion of the second area A2 of the multi-joint hinge structure 113 may be positioned outside the second structure 102.

According to an embodiment, the guide member, e.g., the roller 151, may be rotatably mounted on the second structure 102 in a position adjacent to an edge of the second structure 102 (e.g., the second plate 121a). For example, the roller 151 may be disposed adjacent to an edge (e.g., the portion indicated with reference denotation 'IE') of the second plate 121a parallel to the first side wall 123a. Although no reference denotation is assigned in the drawings, another side wall may extend from the edge of the second plate 121a, and the side wall adjacent to the roller 151 may be substantially parallel to the first side wall 123a. As mentioned above, the side wall of the second structure 102 adjacent to the roller 151 may be formed of a material that transmits light, and a portion of the second area A2 may provide visual information via the portion of the second structure 102 while being received in the second structure 102.

According to an embodiment, an end of the roller 151 may be rotatably coupled to the second side wall 123b, and the other end thereof may be rotatably coupled to the third side wall 123c. For example, the roller 151 may be mounted on the second structure 102, rotating about the rotation axis R perpendicular to the sliding direction (e.g., direction ①) indicated with the arrow in FIG. 1 or 2) of the first structure 101. The rotation axis R may be disposed substantially parallel to the first side wall 123a, and may be positioned away from the first side wall 123a, for example, at one edge of the second plate 121a. According to an embodiment, the gap formed between the outer circumferential surface of the roller 151 and the inner surface of the edge of the second plate 121a may form an entrance through which the multi-joint hinge structure 113 or display 103 enters the second structure 102.

According to an embodiment, when the display 103 is deformed into a curved shape, the roller 151 maintains a radius of curvature of the display 103 to a certain degree, thereby suppressing excessive deformation of the display 103. The term "excessive deformation" may mean that the display 103 is deformed to have a radius of curvature that is too small to damage pixels or signal lines included in the display 103. For example, the display 103 may be moved or deformed while being guided by the roller 151 and may be protected from damage due to excessive deformation. According to an embodiment, the roller 151 may rotate while the multi-joint hinge structure 113 or the display 103 is inserted into or extracted from the second structure 102. For example, the friction between the multi joint hinge structure 113 (or display 103) and the second structure 102 may be suppressed, allowing the multi joint hinge structure 113 (or display 103) to smooth the insertion/extraction of the second structure 102.

According to an embodiment, the support sheet 153 may be formed of a material having flexibility and a certain degree of elasticity, for example, a material including an elastic body such as silicone or rubber. As the roller 151 rotates, with the support sheet 153 mounted or attached to the roller 151, the support sheet 153 may be selectively wound around the roller 151. In the illustrated embodiment, a plurality of (e.g., four) support sheets 153 may be arranged along the direction of the rotation axis R of the roller 151. For example, the plurality of support sheets 153 may be mounted on the roller 151 with them a predetermined distance spaced apart from other adjacent support sheets 153, and the support sheets 153 may extend along a direction perpendicular to the rotation axis R. Alternatively, one support sheet may be mounted or attached to the roller 151. For example, one support sheet may have a size and shape corresponding to the area in which the support sheets 153 are disposed and the area between the support sheets 153 in FIG. 3. As such, the number, size, or shape of the support sheets 153 may be appropriately changed depending on the product actually manufactured. According to an embodiment, as the roller 151 rotates, the support sheet 153 may be rolled up on the outer circumferential surface of the roller 151 or may depart from the roller 151 and unfold in a flat plate shape between the display 103 and the third plate 121c. According to an embodiment, the support sheet 153 may be referred to as a "support belt", "auxiliary belt", "support film" or "auxiliary film".

According to an embodiment, an end of the support sheet 153 may be connected to the first structure 101, e.g., the first plate 111a (e.g., slide plate) and, in a closed state (e.g., the state shown in FIG. 1), the support sheet 153 may be rolled on the roller 151. Therefore, when the first plate 111a moves to the open state (e.g., the state shown in FIG. 2), the support sheet 153 may be gradually positioned between the second structure 102 (e.g., the third plate 121c) and the display 103 (e.g., the second area A2) or between the second structure 102 (e.g., the third plate 121c) and the multi-joint hinge structure 113. For example, at least a portion of the support sheet 153 may be positioned to face the multi joint hinge structure 113 and may be selectively wound around the roller 151 as the first plate 111a slides. The support sheet 153 is generally disposed in contact with the multi joint hinge structure 113, but the portion rolled up around the roller 151 may be substantially separated from the multi-joint hinge structure 113.

According to an embodiment, the gap (e.g., the arrangement gap G of FIG. 22) between the surface of the display 103 and the inner surface of the edge of the second plate 121a may differ depending on the degree to which the support sheet 153 is wound around the roller 151. The smaller the arrangement gap G is, the easier it is to prevent foreign bodies from flowing in, but when the arrangement gap G is too small, the display 103 may contact or rub against the second plate 121a. When direct contact or friction occurs, the surface of the display 103 may be damaged or the sliding operation of the first structure 101 may be obstructed.

According to an embodiment, the support sheet 153 is wound around the roller 151 in the closed state, thus reducing the gap between the inner surface of the edge of the second plate 121a and the surface of the display 103 while keeping the surface of the display 103 not in contact with the second plate 121a. For example, it is possible to prevent foreign bodies from flowing into the inside of the second structure 102 by reducing the arrangement gap G in the closed state. According to an embodiment, as the first structure 101 (e.g., the first plate 111a or the slide plate) gradually moves to the open state, the support sheet 153 may move away from the roller 151 and gradually move to the space between the second structure 102 (e.g., the second plate 121a or the third plate 121c) and the multi joint hinge structure 113. For example, as the first structure 101 moves to the open state, the arrangement gap G gradually increases, suppressing direct friction or contact between the display 103 and other structures (e.g., the second plate 121a) and hence preventing possible damage to the surface of the display 103 due to friction or contact. According to an embodiment, the thickness of the support sheet 153 may gradually increase as the distance between an end (e.g., the portion fixed to the roller 151) and the other end (e.g., the portion fixed to the first plate 111a) reduces. Use of the thickness profile of the support sheet 153 allows for adjustment of the arrangement gap G in the closed state and the open state. A configuration in which the gap (e.g., arrangement distance G) between the surface of the display 103 and the inner surface of the edge of the second plate 121a is adjusted is described below in more detail with reference to FIG. 22.

According to an embodiment, the electronic device 100 may include at least one elastic member 131 and 133 formed of a low density elastic body such as a sponge or a brush. For example, the electronic device 100 may include a first elastic member 131 mounted on one end of the display 103 and, according to an embodiment, the electronic device 100 may further include a second elastic member 133 mounted on the inner surface of the edge of the second plate 121a. The first elastic member 131 may be substantially disposed in the internal space of the second structure 102 and may be positioned to correspond to the edge of the second plate 121a in the open state (e.g., the state shown in FIG. 2). According to an embodiment, the first elastic member 131 may move in the internal space of the second structure 102 as the first structure 101 slides. When the first structure 101 moves from the closed state to the open state, the first elastic member 131 may move toward the edge of the second plate 121a. When the first structure 101 reaches the open state, the first elastic member 131 may contact the inner surface of the edge of the second plate 121a. For example, in the open state, the first elastic member 131 may seal the gap between the inner surface of the edge of the second plate 121a and the surface of the display 103. According to an embodiment, when moving from the closed state to the open state, the first elastic member 131 may move (e.g., slidingly contact) while in contact with the second plate 121a. For example, if a foreign body has been introduced in the gap between the second area A2 and the second plate 121a in the closed state, when moving to the open state, the first elastic member 131 may discharge the foreign body to the outside of the second structure 102.

According to an embodiment, the second elastic member 133 may be attached to the inner surface of the edge of the second plate 121a, and may be disposed to substantially face the inner surface of the display 103. In the closed state, the gap (e.g., the arrangement gap) between the surface of the display 103 and the inner edge of the second plate 121a may be substantially determined by the second elastic member 133. According to an embodiment, in the closed state, the second elastic member 133 may contact the surface of the display 103, substantially sealing the arrangement gap G. According to an embodiment, the second elastic member 133 may be formed of a low-density elastic body such as a sponge or a brush, so that the surface of the display 103 may be prevented from damage despite direct contact with the display 103. According to an embodiment, as the first structure 101 gradually moves to the open state, the arrangement gap G may increase. For example, the display 103 may gradually expose the second area A2 to the outside of the second structure 102 substantially without contacting or rubbing against the second elastic member 133. When the first structure 101 reaches the open state, the first elastic member 131 may contact the second elastic member 133. For example, in the open state, the first elastic member 131 and the second elastic member 133 may seal the arrangement gap G, blocking influx of foreign bodies.

According to an embodiment, the electronic device 100 may further include a guide rail(s) 155 and/or an actuating member(s) 157. The guide rail(s) 155 may be mounted on the second structure 102, e.g., the third plate 121c to guide a sliding of the first structure 101 (e.g., the first plate 111a or the slide plate). The actuating member(s) 157 may include a spring or a spring module that provides an elastic force in a direction to allow both ends thereof to move away from each other. An end of the actuating member(s) 157 may be rotatably supported by the second structure 102, and the other end may be rotatably supported by the first structure 101. When the first structure 101 slides, both the ends of the actuating member(s) 157 may be positioned closest to each other (hereinafter, a 'nearest point') at any one point between the closed state and the open state. For example, in the interval between the nearest point and the closed state, the actuating member(s) 157 may provide an elastic force to the first structure 101 in a direction moving to the closed state and, in the interval between the nearest point and the open state, the actuating member(s) 157 may provide an elastic force to the first structure 101 in a direction moving to the open state.

In the following description, the components easy to understand from the description of the above embodiments are denoted with or without the same reference numerals and their detailed description may be skipped. According to an embodiment, an electronic device (e.g., the electronic device 100 of FIGS. 1 to 3) may be implemented by selectively combining configurations of different embodiments, and the configuration of one embodiment may be replaced by the configuration of another embodiment. However, it is noted that the disclosure is not limited to a specific drawing or embodiment.

Figure 4:
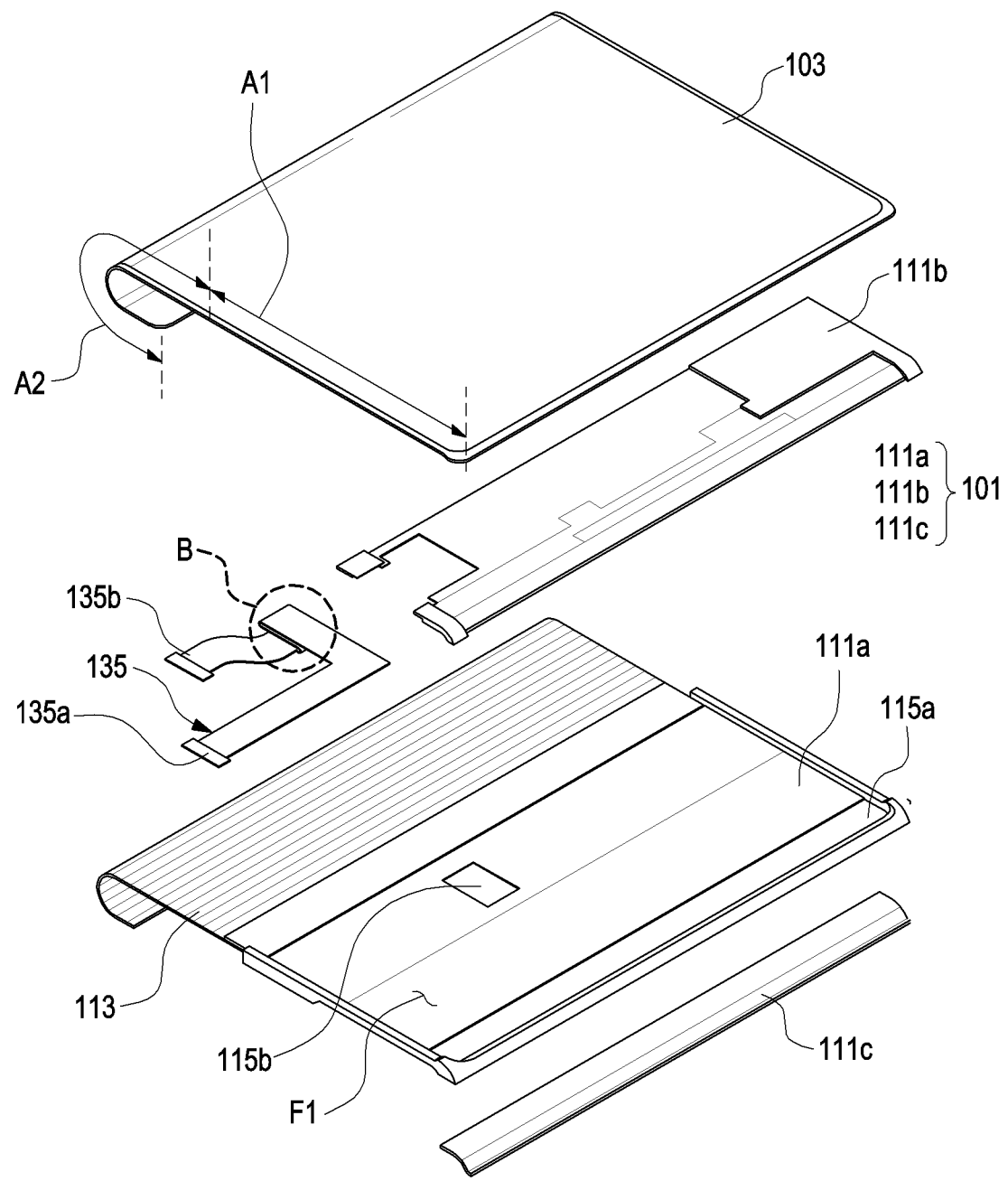
FIG. 4 is an exploded perspective view illustrating a flexible display mounting structure of an electronic device according to an embodiment.
Figure 5:
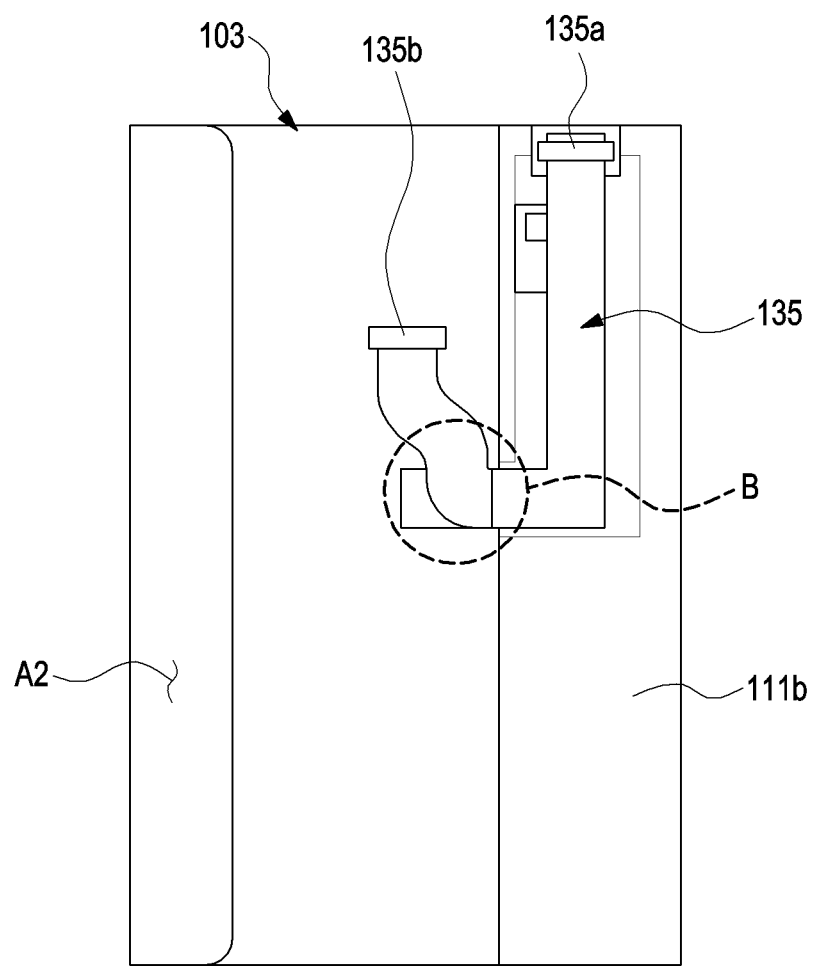
FIG. 5 is a bottom view illustrating a flexible display of an electronic device according to an embodiment.
Figure 6:
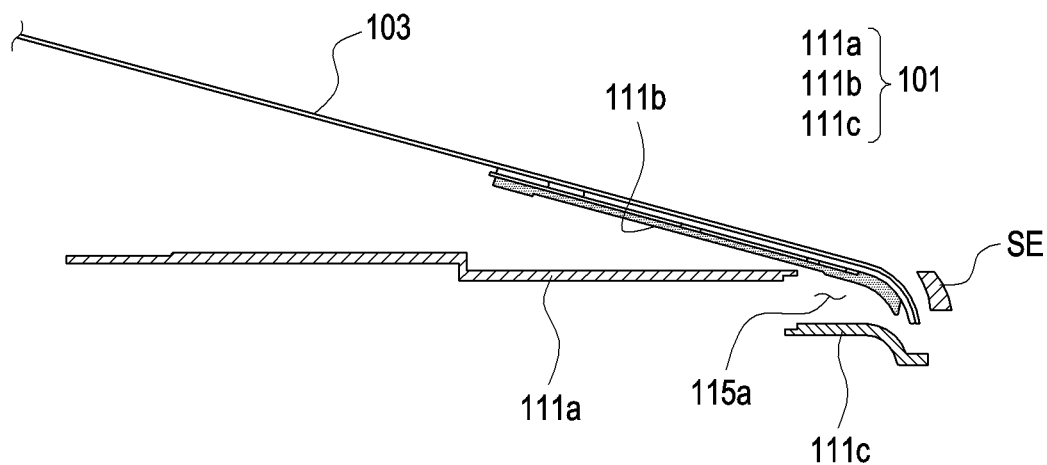
FIG. 6 is a side, cross-sectional view illustrating an example in which a flexible display of an electronic device is mounted, according to an embodiment.

FIG. 4 is an exploded perspective view illustrating a flexible display (e.g., the display 103 of FIGS. 1 to 3) mounting structure of an electronic device (e.g., the electronic device 100 of FIGS. 1 to 3) according to an embodiment. FIG. 5 is a bottom view illustrating a flexible display 103 of an electronic device 100 according to an embodiment. FIG. 6 is a side, cross-sectional view illustrating an example in which a flexible display 103 of an electronic device 100 is mounted, according to an embodiment.

Referring to FIGS. 4 to 6, the first area A1 of the display 103 may be mounted or attached to the first surface F1 of the first structure 101, and the second area A2 may be attached or supported to the multi-joint hinge structure 113. The multi-joint hinge structure 113 may guide or support the deformation of the second area A2 into a curved shape and, in the state exposed to the outside, the multi-joint hinge structure 113 may keep the second area A2 flat while suppressing deformation of the second area A2 due to an external force (e.g., the user's contact). According to an embodiment, the first surface F1 may be formed as the first plate 111a and the first bracket 111b are coupled together. According to an embodiment, a portion of the first area A1 may be directly attached to the first bracket 111b, and another portion thereof may be directly attached to the first plate 111a.

According to an embodiment, the electronic device (e.g., the electronic device 100 of FIGS. 1 to 3) may further include a flexible printed circuit board 135. The flexible printed circuit board 135 may connect the display 103 to a main circuit board (e.g., a printed circuit board received in the second structure 102 of FIGS. 1 to 3). According to an embodiment, a driving chip of the display 103 may be mounted on the flexible printed circuit board 135. When a touch panel is integrated into the display 103, a touch panel driving chip may be mounted on the flexible printed circuit board 135. According to an embodiment, the flexible printed circuit board 135 may be electrically connected to the display 103 or the printed circuit board by including connectors 135a and 135b provided at both ends respectively. According to an embodiment, a portion (hereinafter, a 'bent portion B') of the flexible printed circuit board 135 may be disposed in the electronic device 100 in a bent state.

According to an embodiment, with a portion of the first area A1 mounted on the first bracket 111b, the flexible printed circuit board 135 may be coupled or electrically connected to the display 103 using the first connector 135a. When the first bracket 111b is mounted on the first plate 111a, a portion of the flexible printed circuit board 135 may be disposed between the first bracket 111b and the first plate 111a. For example, a portion of the flexible printed circuit board 135 may be received or fixed between the first bracket 111b and the first plate 111a. The first bracket 111b may be mounted on the first plate 111a while being coupled to the display 103.

According to an embodiment, the first plate 111a may include an assembly hole 115a formed to penetrate at least a portion. Referring to FIG. 6, a portion of the edge of the display 103 may enter the assembly hole 115a, with the display 103 and the first plate 111a inclined with respect to the first plate 111a from the top side of the first plate 111a. When a portion of the edge of the display 103 enters the inside of the assembly hole 115a, the display 103 or the first bracket 111b may be bonded or mounted to the first plate 111a. In the state of being bonded or mounted to the first plate 111a, a portion (e.g., an outer surface of the edge) of the surface of the display 103 may be supported on a side-end structure SE or the inner surface of the assembly hole 115a of the first plate 111a.

According to an embodiment, referring to FIG. 6, the second bracket 111c may be coupled or mounted on the bottom surface of the first plate 111a, closing the assembly hole 115a. For example, the display 103 and/or the first bracket 111b may be easily assembled to the first plate 111a through the assembly hole 115a and, after assembly, the assembly hole 115a may be closed using the second bracket 111c, enhancing the structural stability of the first structure 101. According to an embodiment, a portion of the second bracket 111c may be exposed to the outside of the first structure 101 and may be used as a component decorating the exterior of the electronic device 100.

Figure 7:
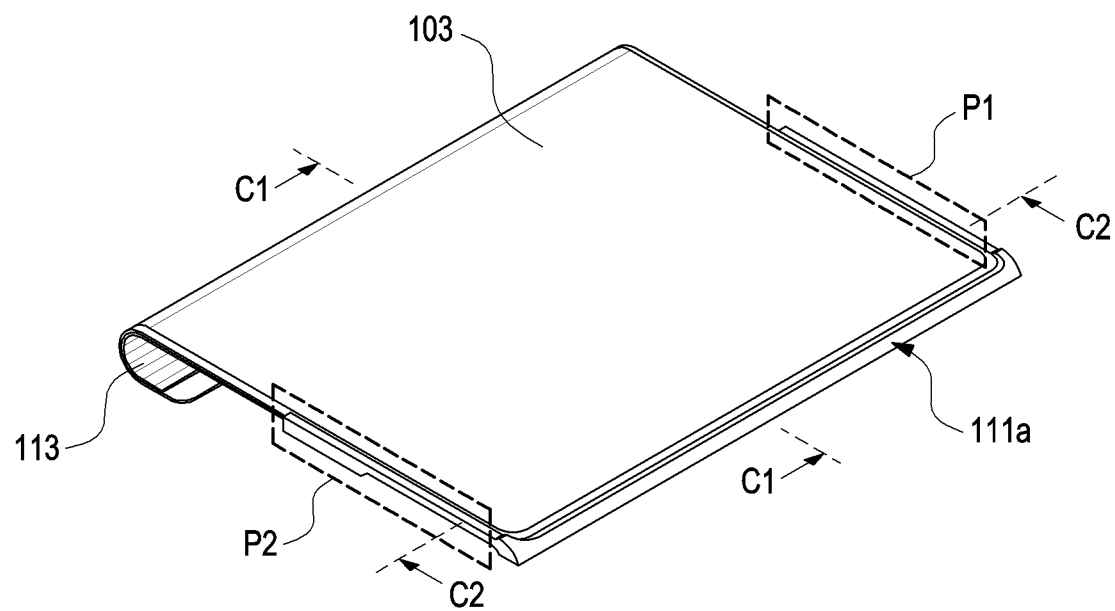
FIG. 7 is a perspective view illustrating an example in which a flexible display of an electronic device is mounted, according to an embodiment.
Figure 8:
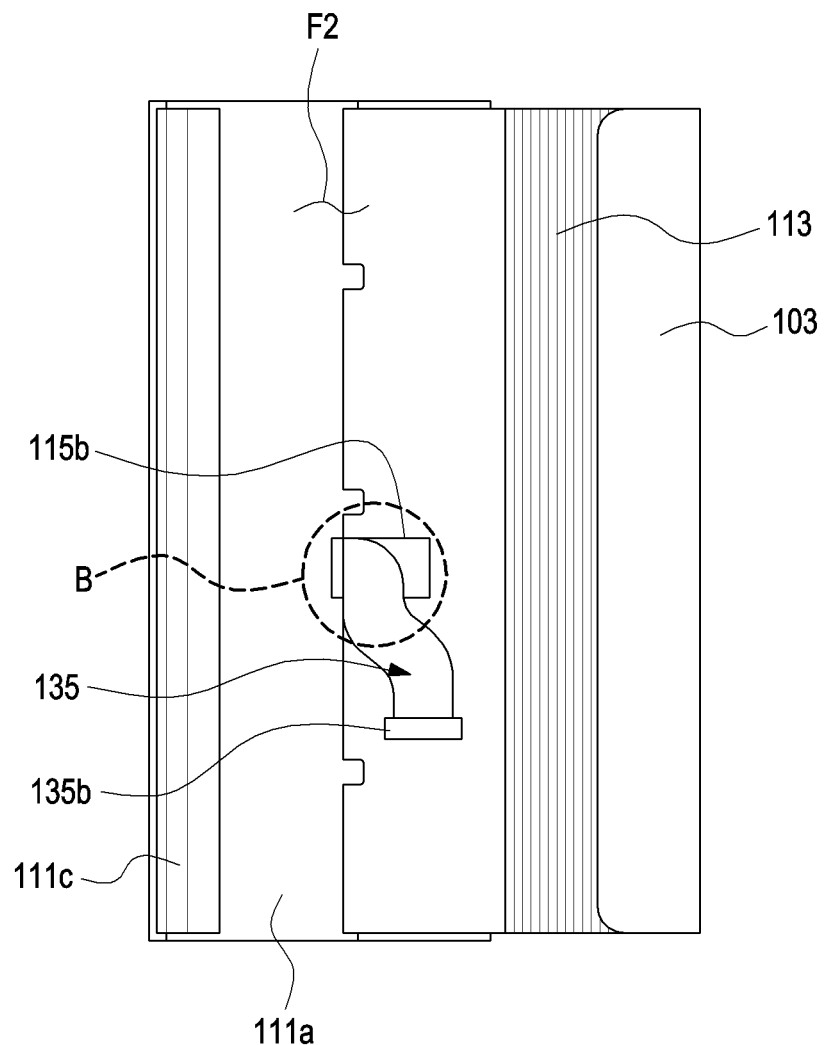
FIG. 8 is a bottom view illustrating an example in which a flexible display of an electronic device is mounted, according to an embodiment.

FIG. 7 is a perspective view illustrating an example in which a flexible display (e.g., the display 103 of FIGS. 1 to 3) of an electronic device (e.g., the electronic device 100 of FIGS. 1 to 3) is mounted according to an embodiment. FIG. 8 is a bottom view illustrating an example in which a flexible display 103 of an electronic device 100 is mounted, according to an embodiment.

Referring to FIGS. 7 and 8, when the display 103 is coupled to the first structure 101, the surface of the display 103 may be flush with a portion (e.g., the upper end P1 and lower end P2) of the surface of the first structure 101. For example, a portion of the surface of the first structure 101 and the surface of the display 103 may be located on one flat surface or one curved surface. Referring to FIGS. 1 and 2, at the top and bottom of the electronic device 100, a portion of the surface of the first structure 101 and the surface of the display 103 may be described as positioned on one flat surface or curved surface.

According to an embodiment, the first plate 111a may further include a wiring hole 115b, and at least a portion, e.g., the bent portion B, of the flexible printed circuit board 135 may be placed inside the wiring hole 115b. In the state where the display 103 is mounted on the first structure 101, a portion, e.g., the bent portion B, of the flexible printed circuit board 135 and the second connector 135b may be exposed to the second surface F2 of the first structure 101. For example, the bent portion B may be at least partially disposed inside the wiring hole 115b, and a portion of the flexible printed circuit board 135 between the second connector 135b and the bent portion B and/or the second connector 135b may be located on the second surface F2 of the first structure 101. The third plate 121c may include another wiring hole (not shown) similar to the wiring hole 115b. The second connector 135b may be disposed inside the second structure 102 or connected to the printed circuit board inside the second structure 102 via the other wiring hole formed in the third plate 121c.

According to an embodiment, when the first structure 101 slides, the bent portion B of the flexible printed circuit board 135 may be deformed. For example, a tensional force may be applied to the flexible printed circuit board 135 due to the sliding of the first structure 101, and this tensional force may be canceled by the deformation of the bent portion B. According to an embodiment, the bent portion B may be substantially deformed within the space inside the wiring hole 115b. According to an embodiment, an additional space (e.g., a dummy recess) may be provided on the surface of the second structure 102 (e.g., the third plate 121c) in an area corresponding to the wiring hole 115b) to receive a portion of the bent portion B.

Figure 9:
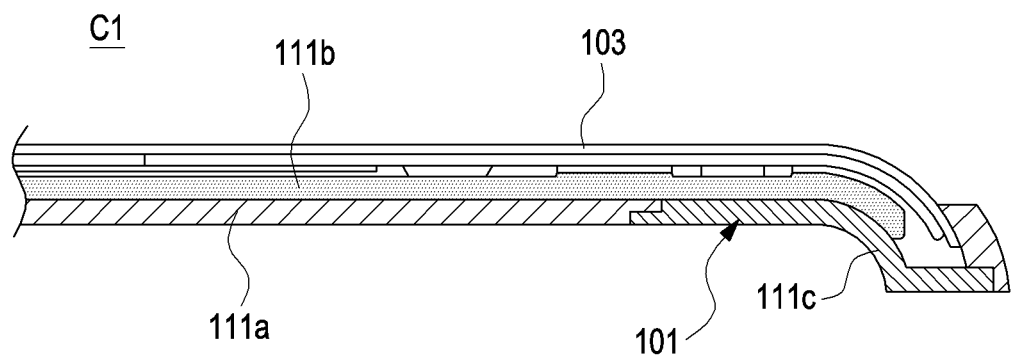
FIG. 9 illustrates a cross-sectional view of the display and/or first structure, taken along line C1 of FIG. 7.
Figure 10:
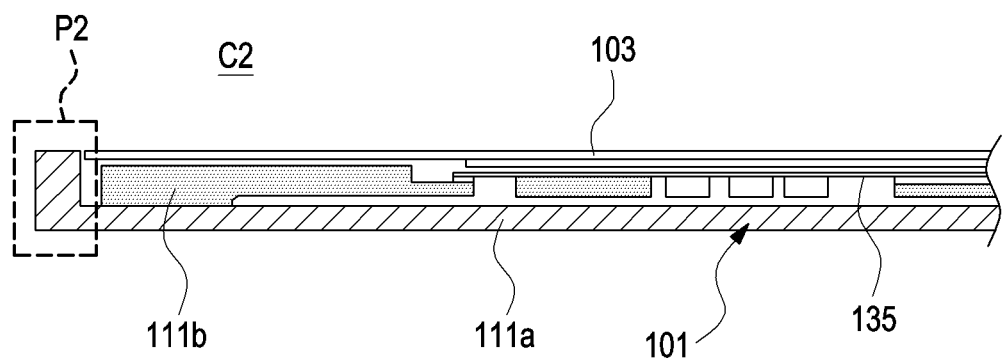
FIG. 10 is a cross-sectional view of the display and/or first structure, taken along line C2 of FIG. 7.

FIG. 9 illustrates a cross-sectional view of the display 103 and/or first structure 101, taken along line C1 of FIG. 7. FIG. 10 is a cross-sectional view of the display 103 and/or first structure 101, taken along line C2 of FIG. 7.

Referring to FIGS. 9 and 10, the display 103 may be supported by the first bracket 111b in an area adjacent to the edge of the inner surface, and a portion of the edge of the outer surface may be supported by the side end structure (SE) (e.g., the inner surface of the assembly hole 115a of FIG. 6) of the first structure 101. For example, at least a portion of the edge of the display 103 may be supported on the inner surface of the assembly hole 115a so that the inner surface of the display 103 may come in tight contact with the first bracket 111b. According to one embodiment, the entire edge of one side of the display 103 may be supported on the inner surface of the assembly hole 115a, and thus at least the first area A1 of the display 103 may remain attached to the first structure 101. In bonding to the mechanical structure, the adhesive component or the adhesive member may be denatured due to long-term possession or use, and the edge or corner of the flexible display (e.g., the display 103) may be separated from the mechanical structure, as set forth above. In the electronic device (e.g., the electronic device 100 of FIGS. 1 to 3) According to an embodiment, when mounting the display 103 on the first structure 101, an edge portion of the display 103 may be supported or pressed, preventing the display 103 from being separated from the mechanical structure (e.g., the first plate 111a or the first bracket 111b).

According to an embodiment, with the display 103 coupled to the first structure 101, the surface of the display 103 may be flush with a portion of the surface of the first structure 101. For example, at the upper or lower portion P2 of the electronic device 100, the surface of the display 103 and a portion of the surface of the first structure 101 may be located on the same flat surface or curved surface. According to one embodiment, although not assigned reference numerals in the drawings, the first plate 111a and/or the first bracket 111b may include a through hole or a recess, providing a space for receiving the flexible printed circuit board 135 or various electronic components disposed on the flexible printed circuit board 135.

Figure 11:
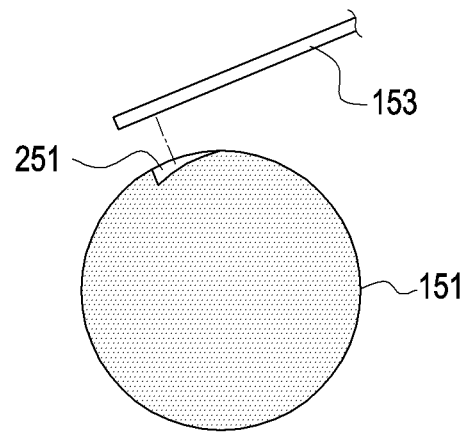
FIGS. 11, 12, and 13 are views illustrating a structure in which a support sheet is mounted on a roller of an electronic device according to an embodiment.
Figure 12:
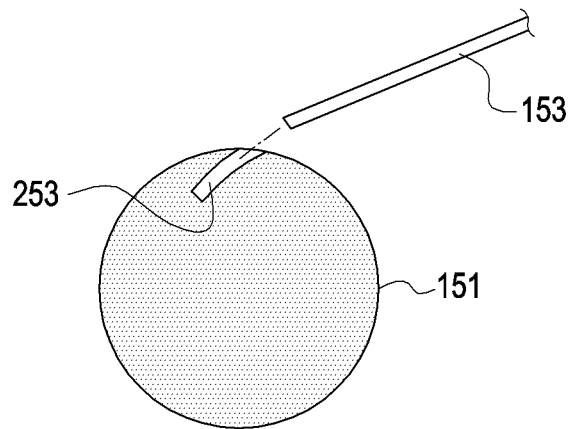
Figure 13:
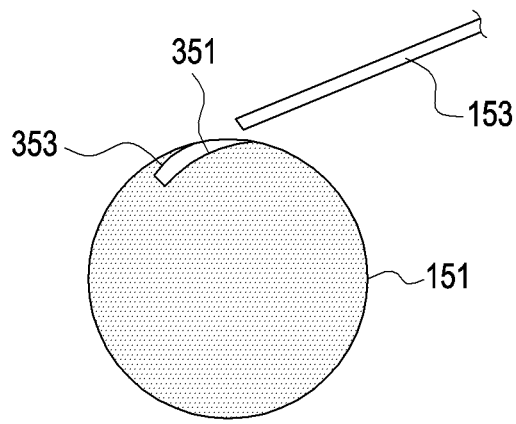

FIGS. 11 to 13 are views illustrating a structure in which a support sheet (e.g., the support sheet 153 of FIG. 3) is mounted on a roller (e.g., the roller 151 of FIG. 3) of an electronic device (e.g., the electronic device 100 of FIGS. 1 to 3) according to an embodiment.

Referring to FIG. 11, the electronic device 100 may further include a mounting recess 251 formed in the surface of the roller 151. A portion, e.g., an end, of the support sheet 153 may be fixed to the mounting recess 251. According to an embodiment, the depth of the mounting recess 251 may gradually increase from the surface of the roller 151 along the circumferential direction, and the increased (or maximum depth of the mounting recess 251 may be equal to or larger than the thickness of one end of the support sheet 153.

Referring to FIG. 12, the electronic device 100 may further include a mounting hole 253 formed in or extending from the surface of the roller 151 to the roller 151. The mounting hole 253 may extend obliquely from the surface of the roller 151, for example, obliquely with respect to the radial direction of the roller 151. One end of the support sheet 153 may be inserted or mounted into the mounting hole 253.

Referring to FIG. 13, the electronic device 100 may include the mounting recess 351 and/or the mounting hole 353 formed in the roller 151. For the sake of brevity, the mounting recess 351 and the mounting hole 353 are separately described. However, according to an embodiment, the term 'mounting recess' or 'mounting hole' may be interpreted as encompassing the mounting recess 351 and mounting hole 353 of FIG. 13. According to an embodiment, the mounting recess 351 may have a depth gradually increasing along the circumferential direction from the surface of the roller 151, and the mounting hole 353 may extend from the end of the mounting recess 351 to the inside of the roller 151. An end of the support sheet 153 may be inserted or mounted into the mounting hole 353, and a portion of the support sheet 153 may be disposed on, or fixed to, the mounting recess 351.

Figure 14:
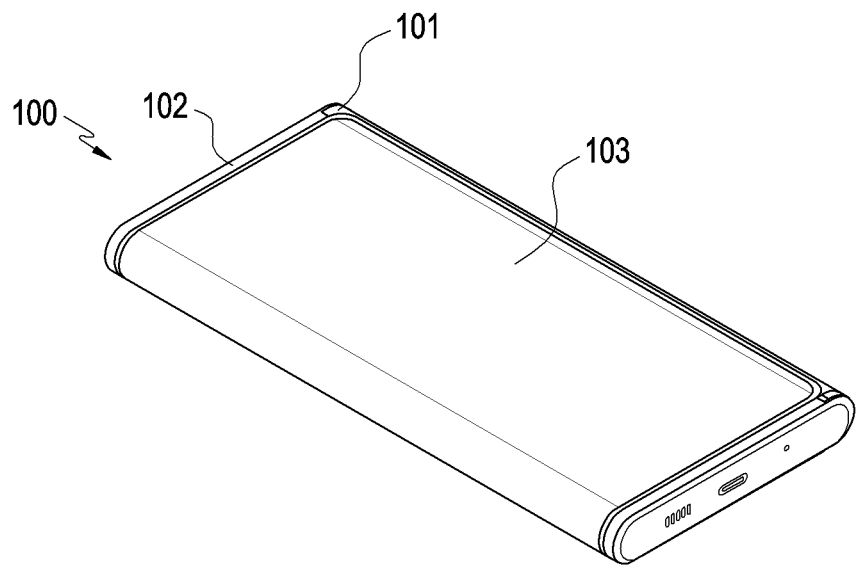
FIG. 14 is a perspective view illustrating an electronic device according to an embodiment, wherein a portion of a flexible display is received in a second structure.
Figure 15:
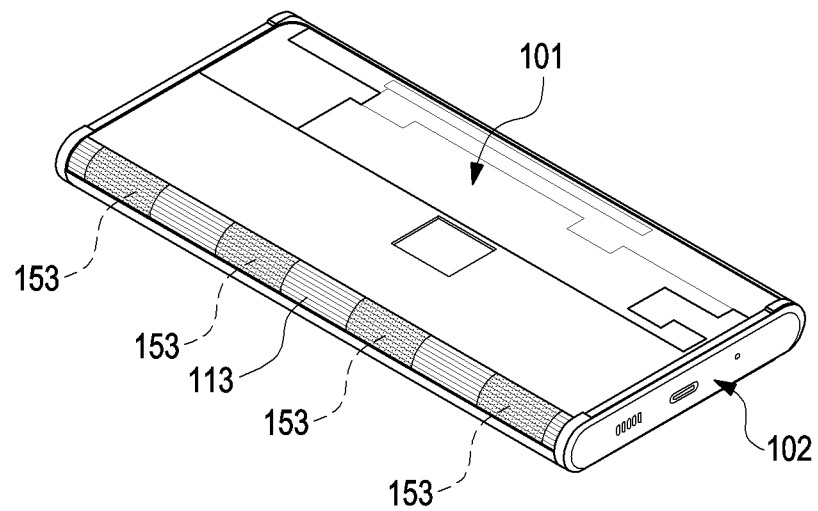
FIG. 15 is a perspective view illustrating a state in which the flexible display is removed from the electronic device of FIG. 14.
Figure 16:
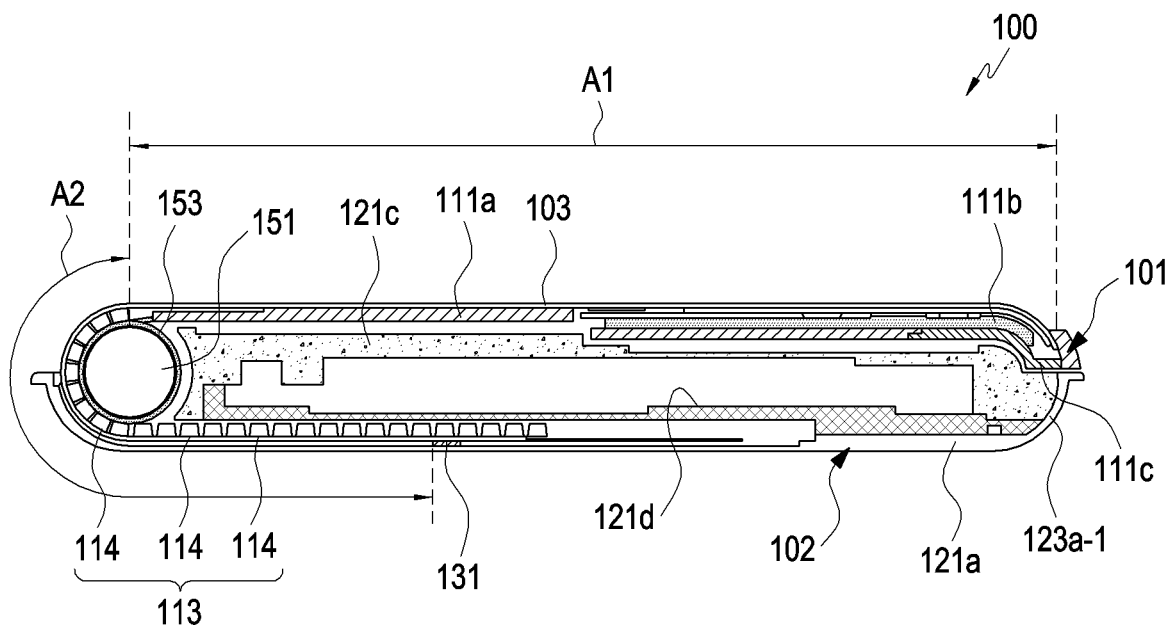
FIG. 16 is a cross-sectional view illustrating an electronic device according to an embodiment, wherein a portion of a flexible display is received in a second structure.
Figure 17:
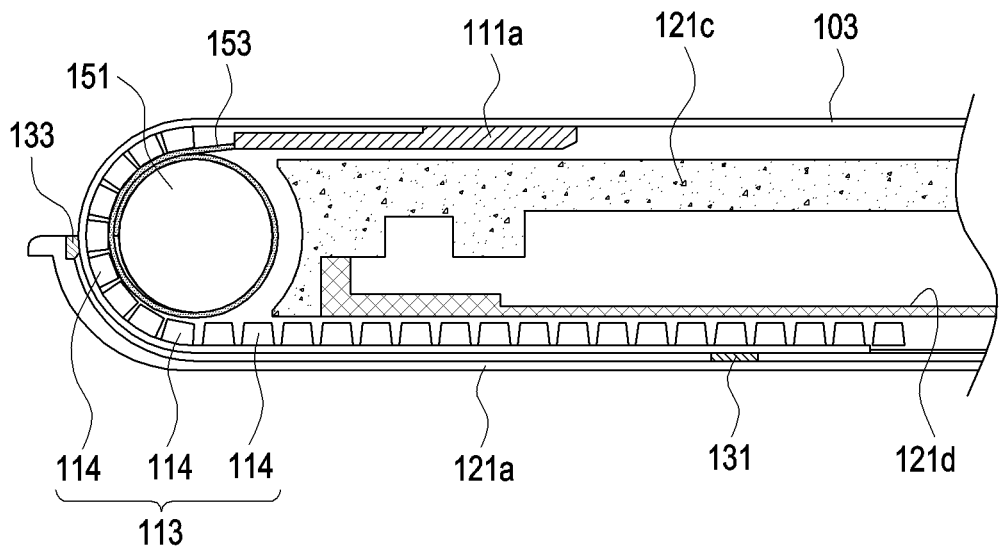
FIG. 17 is an enlarged, cross-sectional view illustrating a portion of FIG. 16.

FIG. 14 is a perspective view illustrating an electronic device (e.g., the electronic device 100 of FIGS. 1 to 3) according to an embodiment, wherein a portion of a flexible display (e.g., the display 103 of FIGS. 1 to 3) is received in a second structure (e.g., the second structure 102 of FIGS. 1 to 3). FIG. 15 is a perspective view illustrating a state in which the flexible display 103 is removed from the electronic device 100 of FIG. 14. FIG. 16 is a cross-sectional view illustrating an electronic device 100 according to an embodiment, wherein a portion of a flexible display 103 is received in a second structure 102. FIG. 17 is an enlarged, cross-sectional view illustrating a portion of FIG. 16.

Referring to FIGS. 14 to 17, in the closed state, the first area A1 of the display 103 may be exposed to the outside of the electronic device 100 (e.g., the second structure 102), and the second area A2 may be received in the second structure 102. For example, in the closed state, the first structure 101 may be positioned adjacent to the roller 151, and the support sheet 153 may be rolled up around the roller 151. As much as the support sheet 153 is wound around the roller 151, the distance, e.g., the arrangement gap (e.g., the arrangement gap G of FIG. 22), between the surface of the display 103 and the inner surface of the edge of the second plate 121a may be reduced. According to an embodiment, as the arrangement gap G decreases, it is possible to suppress or prevent external foreign bodies from flowing into the inside of the second structure 102 through the arrangement gap G. According to an embodiment, the second area A2 or the multi-joint hinge structure 113 inside the second structure 102 may be generally received in a space between the second plate 121a (e.g., rear case) and the support member 121d. As described above, the space in which the second area A2 or the multi-joint hinge structure 113 is received may be separated by the support member 121d from the space (e.g., the space between the third plate 121c and the support member 121d) in which the printed circuit board is received.

According to an embodiment, the rods 114 of the multi-joint hinge structure 113 may be generally arranged along the sliding direction ① of the first structure 101, and some may be arranged around the roller 151. The multi-joint hinge structure 113 may support the second area A2 of the display 103 in a flat shape while maintaining a substantially flat shape. According to an embodiment, the multi joint hinge structure 113 may deform a portion of the second area A2 into a curved shape while deforming into a curved shape around the roller 151. According to an embodiment, in the closed state, the first elastic member (e.g., the first elastic member 131 of FIG. 3) may be disposed to face the inner surface of the second plate 121a inside the second structure 102. When the first structure 101 gradually moves to the open state, the first elastic member 131 may move in a direction toward the edge of the second plate 121a, e.g., the second elastic member 133.

According to an embodiment, when moving to the open state, the first structure 101 may gradually move away from the roller 151, and the second area A2 or the multi joint hinge structure 113 may move to the outside of the second structure 102. For example, as the first structure 101 moves to the open state, the second area A2, along with the multi-joint hinge structure 113 connected to the first structure 101, may gradually be exposed to the outside of the second structure. When the first structure 101 slides, the roller 151 may rotate correspondingly and guide the multi-joint hinge structure 113 to the outside of the second structure 102. For example, while the multi-joint hinge structure 113 moves to the outside of the second structure 102 (or while being received in the second structure 102), the roller 151 may mitigate direct contact or friction between the multi joint hinge structure 113 and the second structure 102. According to an embodiment, since an end of the support sheet 153 is connected to the first structure 101, the support sheet 153 may gradually depart from the roller 151 and move onto the second structure 102 (e.g., the third plate 121c) as the first structure 101 slides. For example, the support sheet 153 may be deformed into a flat plate shape while gradually moving between the display (or multi-joint hinge structure) and the second structure (e.g., the second plate 121a or the third plate 121c). When reaching the open state, the support sheet 153 may be disposed in an unfolded state inside (e.g., the rear surface) the display 103, for example, the second area A2. According to an embodiment, as the support sheet 153 gradually escapes from the roller 151, the gap (e.g., the arrangement gap G of FIG. 22) between the surface of the display 103 and the second plate 121a (e.g., the inner side of the edge) may gradually increase. For example, as the first structure 101 moves from the closed state to the open state, the gap between the surface of the display 103 and the second plate 121a increases, so that the second area A2 may move to the outside of the second structure 102 without causing the surface of the display 103 to contact or rub against other structures.

Figure 18:
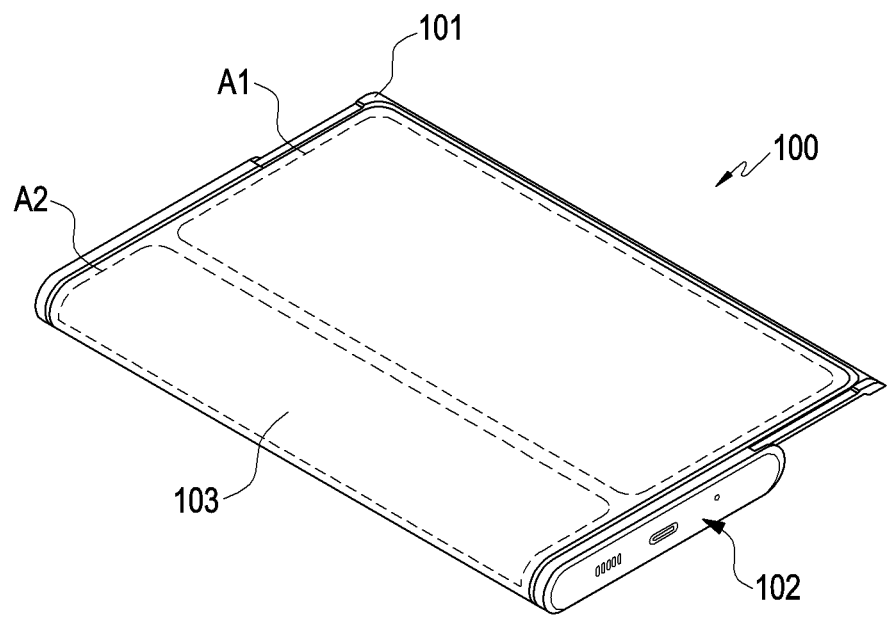
FIG. 18 is a perspective view illustrating an electronic device according to an embodiment, wherein most of a flexible display is exposed to the outside of a second structure.
Figure 19:
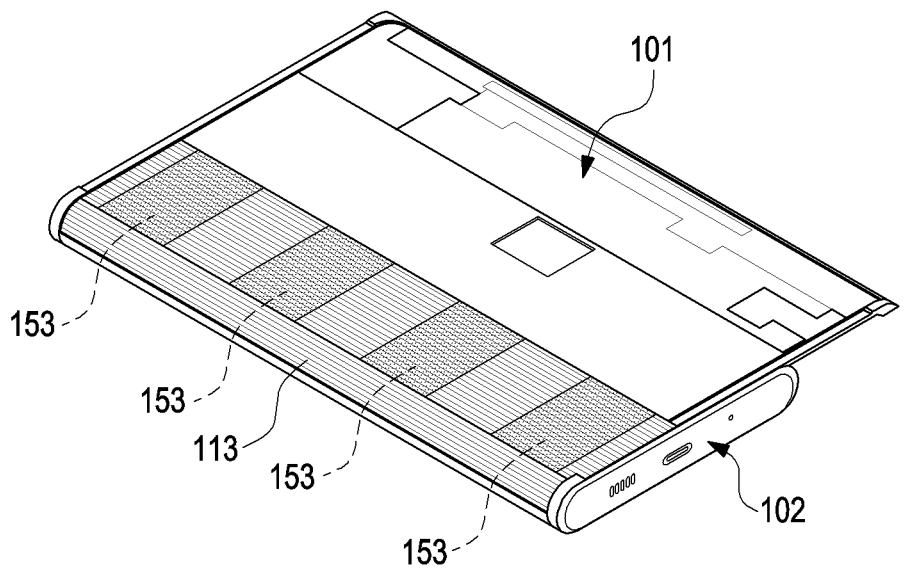
FIG. 19 is a perspective view illustrating a state in which the flexible display is removed from the electronic device of FIG. 18.
Figure 20:
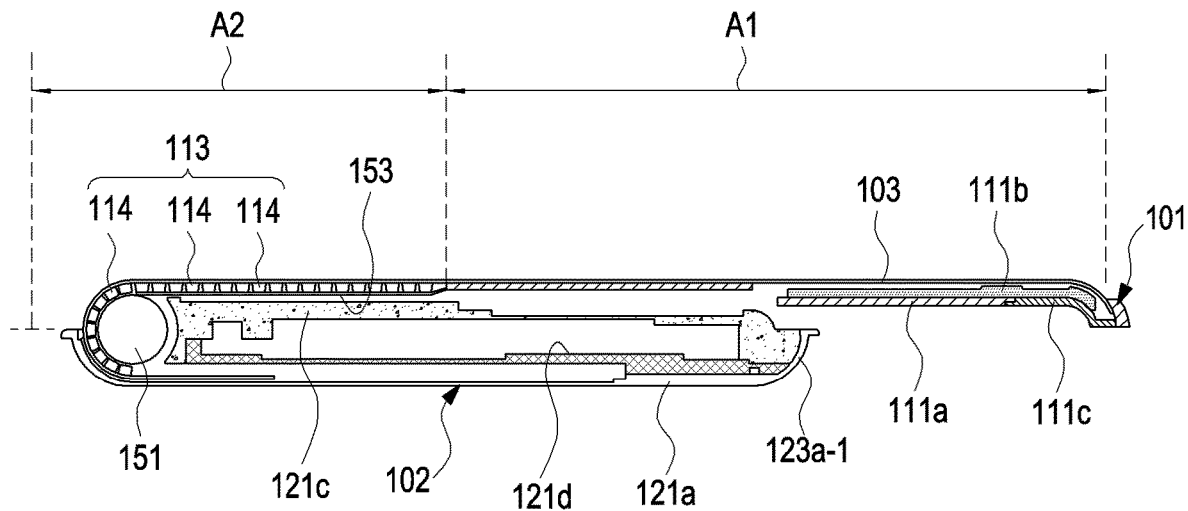
FIG. 20 is a cross-sectional view illustrating an electronic device according to an embodiment, wherein most of a flexible display is exposed to the outside of a second structure.
Figure 21:
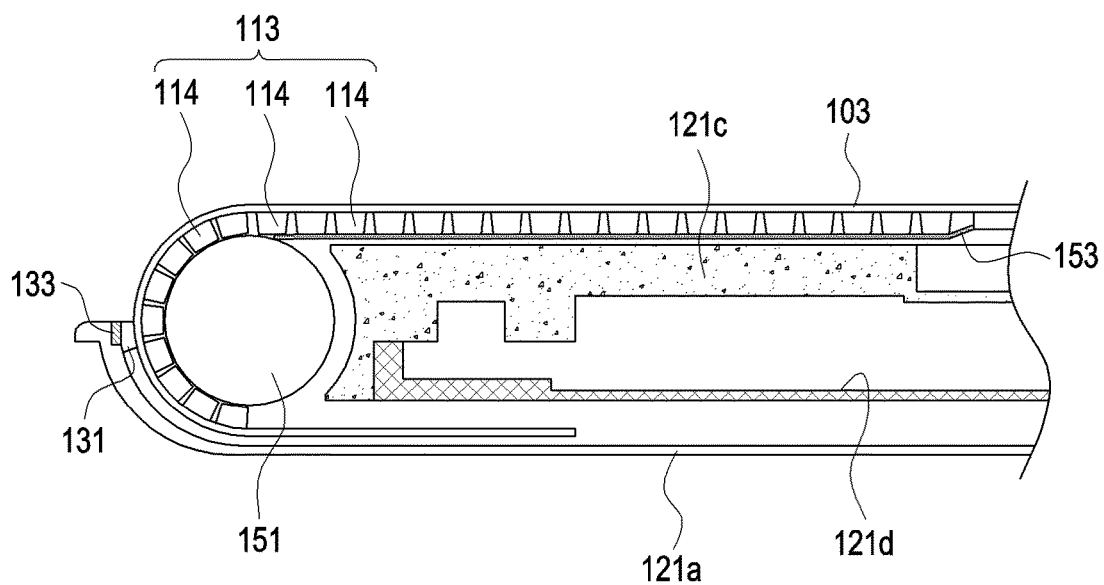
FIG. 21 is an enlarged, cross-sectional view illustrating a portion of FIG. 20.

FIG. 18 is a perspective view illustrating an electronic device (e.g., the electronic device 100 of FIGS. 1 to 3) according to an embodiment, wherein most of a flexible display (e.g., the display 103 of FIGS. 1 to 3) is exposed to the outside of a second structure (e.g., the second structure 102 of FIGS. 1 to 3). FIG. 19 is a perspective view illustrating a state in which the flexible display 103 is removed from the electronic device 100 of FIG. 18. FIG. 20 is a cross-sectional view illustrating an electronic device 100 according to an embodiment, wherein most of a flexible display 103 is exposed to the outside of a second structure 102. FIG. 21 is an enlarged, cross-sectional view illustrating a portion of FIG. 20.

Referring to FIGS. 18 to 21, in the open state, the second area A2 together with the first area A1 of the display 103 may be exposed to the outside of the second structure 102. For example, in the open state, the first structure 101 may be located away from the roller 151, and the second area A2, the multi-joint hinge structure 113 and/or the support sheet 153 may be located in an area between the roller 151 and the first plate 111a (or the first area A1). According to an embodiment, as the first structure 101 moves to the open state, the support sheet 153 may be positioned between the display 103 (e.g., the second area A2) and the second structure 102 or between the multi-joint hinge structure 113 and the second structure 102. In the open state, since the support sheet 153 substantially gradually departs from the roller 151 and is disposed in a flat plate shape on the second structure 102, the arrangement gap (e.g., the gap between the surface of the display 103 and the inner surface of the edge of the second plate 121a) may be increased. When the first structure 101 reaches the open state, the first elastic member 131 may be positioned adjacent to the edge of the inner surface of the second plate 121a. According to an embodiment, in the open state, the first elastic member 131 may contact the inner surface of the second plate 121a, thereby substantially sealing the gap between the edge of the second plate 121a and the display 103. For example, as the gap between the edge of the second plate 121a and the display 103 is sealed in the closed state and/or, in the open state, the second elastic member 133 substantially seals the gap between the edge of the second plate 121a and the display 103, it is possible to prevent foreign bodies from flowing into the inside of the second structure 102 through the gap between the edge of the second plate 121a and the display 103.

Figure 22:
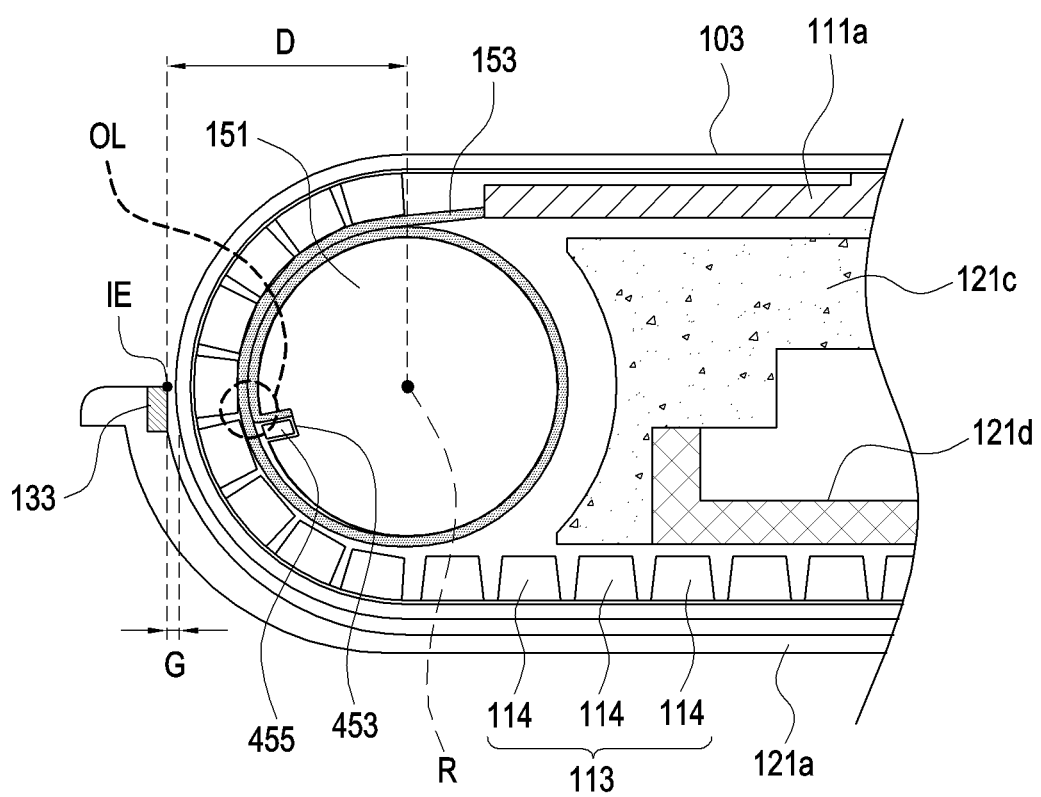
FIG. 22 is a view illustrating a structure in which a support sheet of an electronic device is wound around a roller according to an embodiment.

FIG. 22 is a view illustrating a structure in which a support sheet (e.g., the support sheet 153 of FIG. 3) of an electronic device (e.g., the electronic device 100 of FIGS. 1 to 3) is wound around a roller (e.g., the roller 151 of FIG. 3) according to an embodiment.

Referring to FIG. 22, according to an embodiment, the second elastic member 133 is disposed on the inner surface of the edge of the second plate 121a. In the following detailed description, the "inner surface of the edge of the second plate 121a" may mean a point defining the boundary between the internal space and the outer space of the second structure 102. As an example, this point is denoted as 'IE' in FIG. 22, and such a point is referred to below as a "boundary point (IE)". Although FIG. 22 illustrates a cross section of a portion of the electronic device 100, and the boundary point IE is shown as a point, the boundary point IE may substantially mean a line parallel to the first side wall 123a or the rotation axis R. FIG. 22 shows a configuration in which the boundary point (IE) is disposed in the second elastic member 133 but, for the sake of brevity of the description, a configuration in which the "boundary point (IE) is positioned at the edge of the second plate 121a or in the inner surface of the edge" may be described. For example, according to an embodiment, the boundary point IE may be located at the edge of the second plate 121a and, in a structure in which the second elastic member 133 is disposed, the boundary point IE may be positioned in the second elastic member 133.

Referring to FIG. 22, the electronic device (e.g., the electronic device 100 of FIGS. 1 to 3) may include a mounting hole 453 formed in the roller 151. The mounting hole 453 may extend from the surface of the roller 151 to the inside, for example, along the radial direction of the roller 151. An end of the support sheet 153 may be inserted or, fixed, into the mounting hole 453. According to an embodiment, the electronic device 100 may further include a fixing member 455 received in the mounting hole 453. The fixing member 455 may tightly contact an inner wall of the mounting hole 453 and/or an end of the support sheet 153, for example. For example, the fixing member 455 may fix an end of the support sheet 153 to the inside of the mounting hole 453. According to an embodiment, the fixing member 455 may be formed of a material including an elastic material (e.g., silicon or rubber) and may be fixed inside the mounting hole 453 in a compressed state, allowing one end of the support sheet 153 to be stably fixed inside the mounting hole 453.

According to an embodiment, the gap (e.g., arrangement gap G) between the surface of the display 103 and the inner surface (e.g., the boundary point IE) of the edge of the second plate 121a may be a passage through which foreign bodies may flow into the inside of the second structure 102. As discussed above, in the closed state, the support sheet 153 may be wound around the roller 151 so that the arrangement gap G may be reduced and, in the open state, the arrangement gap G is increase but may be sealed by the first elastic member 131 as shown in FIG. 21. According to an embodiment, the distance (D) between the boundary point (IE) and the rotation axis (R) of the roller 151 may include the arrangement gap (G) and the thickness of the support sheet 153 rolled up around the roller 151. The distance D, the radius of the roller 151, and the thickness of the display 103 or the multi-joint hinge structure 113 may be substantially constant. For example, the arrangement gap G and the thickness of the support sheet 153 rolled up around the roller 151 between the inner surface (e.g., boundary point IE) of the edge of the second plate 121a and the rotation axis R of the roller 151 may be inversely proportional. For example, in the closed state, the support sheet 153 is wound around the roller 151, reducing (minimizing) the arrangement gap G. As the first structure 101 (e.g., the first plate 111a) moves to the open state, the thickness of the support sheet 153 rolled up on the roller 151 gradually decreases, increasing the arrangement gap G.

According to an embodiment, in the closed state, for example, in a state in which the second area A2 or the multi joint hinge structure 113 is substantially received inside the second structure 102, at least two different portions of the support sheet 153 may overlap (OL) each other between the boundary point IE and the rotation axis R. For example, when the thickness of the support sheet 153 is constant and is defined as "T", the sum of the thicknesses of the support sheet 151 wound around the roller 151 may be defined as "n*T". Here, 'n' may mean the number of windings of the support sheet 153 or the number of overlaps of different portions of the support sheet 153 between the boundary point IE and the rotation axis R and, in the state where the support sheet 153 is not wound around the roller 151 (e.g., the state where the support sheet 153 does not exist between the boundary point IE and the rotation axis R), the sum of the thicknesses of the wound support sheet 153 may be defined as "0 (zero)." For example, if the increased (maximum) value of the arrangement gap G, e.g., the arrangement gap G in the open state, is "Gmax", the arrangement gap G may be defined as "Gmax−n*T". In FIG. 22, the thickness of the support sheet 153 may be about 0.2 mm and, since the two portions of the support sheet 153 overlap between the boundary point IE and the rotation axis R, the arrangement gap G may be calculated as "Gmax−2*0.2". For example, although there may be some differences depending on embodiments, the reduced (minimum) arrangement gap may be approximately 0.4 mm smaller than the increased (maximum) arrangement gap Gmax in the illustrated embodiment.

According to an embodiment, the support sheet 153 may have a profile that gradually increases in thickness from a portion mounted on the roller 151 to a portion connected to the first structure 101 (e.g., the first plate 111a). For example, the sum of the thicknesses of the support sheet 153 rolled on the roller 151 between the boundary point IE and the rotation axis R may gradually change according to the rotation angle (or position) of the roller 151. According to an embodiment, the arrangement gap G may gradually increase according to the sliding of the first structure 101 to the open state or the rotation of the roller 151 while having a reduced (minimum) value in the closed state. For example, as the first structure 101 moves to the open state, the arrangement gap G may increase, and the display 103 may gradually move away from another structure, for example, the inner surface of the second plate 121a.

According to an embodiment, an electronic device (e.g., the electronic device 100 of FIGS. 1 to 3) comprises a first structure (e.g., the first structure 101 of FIGS. 1 to 3) including a first plate (e.g., the first plate 111a of FIGS. 1 to 3) providing a first surface (e.g., the first surface F1 of FIG. 3 or 4) and a second surface (e.g., the second surface F2 of FIG. 8) facing away from the first surface, a second structure (e.g., the second structure 102 of FIGS. 1 to 3) coupled to surround at least a portion of the first structure and guiding a sliding of the first structure in a direction parallel with the first surface or the second surface of the first structure, a roller (e.g., the roller 151 of FIG. 3) rotatably mounted on an edge of the second structure, a flexible display (e.g., the display 103 of FIGS. 1 to 3) including a first area (e.g., the first area A1 of FIG. 3) mounted on the first surface of the first structure and a second area (e.g., the second area A2 of FIG. 3) extending from the first area, the second area of the flexible display guided at least partially by the roller to be inserted or received from a side of the second structure to an inside of the second structure or exposed to an outside of the second structure as the first structure is slid, and at least one support sheet (e.g., the support sheet 153 of FIG. 3) mounted on the roller and selectively wound around the roller as the roller rotates, wherein the support sheet is wound around the roller when the second area is received inside the second structure, and is unfolded inside (e.g., the rear surface of the second area) the second area when the second area is exposed to the outside of the second structure.

According to an embodiment, the electronic device may further comprise a mounting recess (e.g., the mounting recess 251 or 351 of FIG. 11 or 13) formed in a surface of the roller. A portion of the support sheet may be fixed to the mounting recess.

According to an embodiment, the electronic device may further comprise a mounting hole (e.g., the mounting hole 253 or 353 of FIG. 12 or 13) formed from a surface of the roller to an inside of the roller. An end of the support sheet may be mounted inside the mounting hole.

According to an embodiment, the plurality of support sheets may be arranged along a direction of a rotation axis (e.g., the rotation axis R of FIG. 3 or 22) of the roller. The support sheets may extend in a direction perpendicular to the rotation axis.

According to an embodiment, the second structure may include a second plate (e.g., the second plate 121a of FIG. 3) facing away from the first surface. The second area may be inserted into an inside of the second structure through a gap between the roller and the second plate.

According to an embodiment, a gap (e.g., the arrangement gap G of FIG. 22) between the display and an inner surface of an edge of the second plate when the second area is received inside the second structure (e.g., the state shown in FIG. 1) may be smaller than a gap between the display and the inner surface of the edge of the second plate when the second area is exposed to the outside of the second structure (e.g., the state shown in FIG. 2).

According to an embodiment, the second structure may include a second plate (e.g., the second plate 121a of FIG. 3) facing away from the first surface, a first side wall (e.g., the first side wall 123a of FIGS. 1 to 3) perpendicular to the second plate, a second side wall (e.g., the second side wall 123b of FIGS. 1 to 3) perpendicular to the second plate and the first side wall, and a third side wall (e.g., the third side wall 123c of FIGS. 1 to 3) perpendicular to the second plate and the first side wall and parallel to the second side wall. The roller may be rotatably mounted between the second side wall and the third side wall in a position adjacent to an edge of the second plate. The roller may rotate about the rotation axis extending parallel to the first side wall.

According to an embodiment, the flexible display may be inserted into the inside of the second structure through a gap between an inner surface of the edge of the second plate and the roller.

According to an embodiment, the electronic device may further comprise an elastic member (e.g., the first elastic member 131 of FIG. 3) mounted on an end of the flexible display and moving inside the second structure as the first structure slides. The elastic member may slidingly contact the second plate as the second area gradually moves to a position where the second area is exposed to the outside of the second structure and, when the second area is exposed to the outside of the second structure, the elastic member may be positioned between the inner surface of the edge of the second plate and a surface of the flexible display.

According to an embodiment, the electronic device may further comprise a multi joint hinge structure (e.g., the multi joint hinge structure 113 of FIG. 16 or 17) including a plurality of rods (e.g., the rods 114 of FIG. 16 or 17) supporting the second area and connected to the first structure to move over the second structure as the first structure slides. As the first structure slides, a portion of the multi joint hinge structure may be deformed to a curved shape in a position corresponding to the roller.

According to an embodiment, the support sheet may have a first end fixed to the roller and a second end fixed to the first structure. At least a portion of the support sheet may be positioned to face the multi joint hinge structure or wound around the roller.

According to an embodiment, the rods may be arranged along a direction perpendicular to the rotation axis, in parallel to the rotation axis. When the second area is exposed to the outside of the second structure, the support sheet may be positioned between the second structure and the multi-joint hinge structure.

According to an embodiment, an electronic device may comprise a housing (e.g., the second structure 102 of FIGS. 1 to 3) including a rear case (e.g., the second plate 121a of FIG. 3) and a side wall (e.g., the side walls 123a, 123b, and 123c of FIGS. 1 to 3) extending from the rear case, a roller (e.g., the roller 151 of FIG. 3) rotatably mounted in the housing while being positioned adjacent to a portion of the side wall, at least one support sheet (e.g., the support sheet 153 of FIG. 3) mounted on the roller and selectively wound around the roller as the roller rotates, and a flexible display (e.g., the display 103 of FIGS. 1 to 3) including a first area exposed to an outside of the housing and a second area extending from the first area, the second area of the flexible display guided by the roller to be at least partially inserted or received inside the housing or exposed to the outside of the housing. The support sheet may be gradually wound around the roller as the second area is gradually received inside the housing. When the second area is exposed to the outside of the housing, the support sheet may be positioned between the rear case and the second area.

According to an embodiment, when the second area is received inside the housing, at least two different portions (e.g., the portions denoted with 'OL' in FIG. 22) of the support sheet may be disposed to overlap between an edge of the rear case and a rotation axis of the roller.

According to an embodiment, the electronic device may further comprise a multi joint hinge structure including a plurality of rods supporting the second area and, as the roller rotates, guided by the roller to be inserted or received inside the housing or extracted to the outside of the housing. The multi-joint hinge structure may be at least partially deformed to a curved shape in a position corresponding to the roller.

According to an embodiment, when the second area is exposed to the outside of the housing, the support sheet may be disposed between the rear case and the multi-joint hinge structure.

According to an embodiment, the plurality of support sheets may be arranged along a direction of a rotation axis of the roller. The support sheets may extend in a direction perpendicular to the rotation axis.

According to an embodiment, the electronic device may further comprise a slide plate slidably coupled to the housing. The first area may be mounted on the slide plate.

According to an embodiment, the support sheet may have a first end fixed to the roller and a second end fixed to the slide plate. At least a portion of the support sheet may be positioned to face the second area or is wound around the roller.

According to an embodiment, the electronic device may further comprise at least one elastic member (e.g., the first elastic member 131 or second elastic member 133 of FIG. 3) mounted on at least one of an end of the flexible display and an inner surface of an edge of the rear case. When at least the second area is exposed to the outside of the housing, the elastic member may be positioned between the inner surface of the edge of the rear case and a surface of the flexible display.

Although the present disclosure has been described with various embodiments, various changes and modifications may be suggested to one skilled in the art. It is intended that the present disclosure encompass such changes and modifications as fall within the scope of the appended claims.

What is claimed is:

1. An electronic device, comprising:
a flexible display including a first area and a second area extending from the first area;
a first structure configured to support the first area of the flexible display and slide relative to a second structure;
the second structure configured to guide a sliding of the first structure such that the second area of the flexible display is exposed to an outside of the second structure when the first structure is at an open position or is allowed to be received in the second structure when the first structure is at a closed position, wherein the first area of the flexible display is substantially flat shaped and exposed to the outside of the second structure when at the open and the closed positions;
a roller disposed in the second structure and configured to guide the second area of the flexible display to deform between a flat shape and curved shapes according to the sliding of the first structure; and
a support sheet configured to wind around the roller as the first structure is slid in to the closed position or unwind from the roller as the first structure is slid out to the open position for maintaining a first curvature and a second curvature substantially to a certain degree,
wherein the first curvature is a curvature of a curved shaped portion of the second area when the first structure is at the closed position and the second curvature is the curvature of a curved shaped portion of the second area when the first structure is at the open position, the first curvature being decreased compared to the second curvature, and
wherein a flat shaped portion of the second area is received in the second structure as the support sheet is wound around the roller.

2. The electronic device of claim 1, wherein a portion of the second area is configured to be deformed into the curved shape in a position corresponding to the roller, and
wherein a remaining portion of the second area inserted or received in the second structure while being guided by the roller is configured to be deformed into a flat shape.

3. The electronic device of claim 2, wherein the support sheet is configured to:
separate from the remaining portion of the second area that is deformed into the flat shape,
wind around the roller as the second area is received into the second structure, and
unwind from the roller as the first structure is slid and the second area is exposed to the outside of the second structure.

4. The electronic device of claim 1, further comprising:
a mounting recess formed in a surface of the roller,
wherein a portion of the support sheet is fixed to the mounting recess.

5. The electronic device of claim 1, further comprising a mounting hole formed from a surface of the roller to an inside of the roller, wherein an end of the support sheet is mounted inside the mounting hole.

6. The electronic device of claim 1, wherein:
a plurality of support sheets is arranged along a direction of a rotation axis of the roller, and
each of the plurality of support sheets extends in a direction perpendicular to the rotation axis.

7. The electronic device of claim 1, wherein:
the second area is inserted into an inside of the second structure through a gap between the roller and a second plate included in the second structure.

8. The electronic device of claim 1, wherein:
the second structure further includes:
a first side wall perpendicular to a second plate included in the second structure,
a second side wall perpendicular to the second plate and the first side wall, and
a third side wall perpendicular to the second plate and the first side wall and parallel to the second side wall,
the roller is mounted between the second side wall and the third side wall in a position adjacent to an edge of the second plate,
the roller rotates about a rotation axis extending parallel to the first side wall, and
the flexible display is inserted into an inside of the second structure through a gap between an inner surface of the edge of the second plate and the roller.

9. The electronic device of claim 8, further comprising:
an elastic member mounted on an end of the flexible display and configured to move inside the second structure as the first structure slides,
wherein the elastic member slidingly contacts the second plate as the second area gradually moves to a position where the second area is exposed to the outside of the second structure and, when the second area is exposed to the outside of the second structure, the elastic member is positioned between an inner surface of the edge of the second plate and a surface of the flexible display.

10. The electronic device of claim 4, further comprising:
a multi-joint hinge structure including a plurality of rods supporting the second area and connected to the first structure and configured to move over the second structure as the first structure slides,
wherein as the first structure slides, a portion of the multi-joint hinge structure is deformed to a curved shape in a position corresponding to the roller.

11. The electronic device of claim 10, wherein:
the support sheet has a first end fixed to the roller and a second end fixed to the first structure, and
at least a portion of the support sheet is positioned to face the multi-joint hinge structure or wind around the roller.

12. The electronic device of claim 10, wherein:
the rods are arranged along a direction perpendicular to a rotation axis, in parallel to the rotation axis, and
when the second area is exposed to the outside of the second structure, the support sheet is positioned between the second structure and the multi-joint hinge structure.

13. An electronic device, comprising:
a housing including a rear case and a side wall extending from the rear case;
a roller mounted in the housing while being positioned adjacent to a portion of the side wall;
a support sheet mounted on the roller and configured to wind around the roller as the roller rotates; and
a flexible display including a first area exposed to an outside of the housing when at a closed position and when at an open position extending a predetermined distance from the side wall, and a second area extending from the first area, the second area of the flexible display guided by the roller to be at least partially inserted or received inside the housing as the first area is slid the predetermined distance between the open position and the closed position or exposed to the outside of the housing when the first area is at the open position,
wherein while the second area is at least partially inserted or received inside the housing and being guided by the roller, a portion of the second area is configured to be deformed into a curved shape in a position corresponding to the roller and a remaining portion of the second area inserted or received in the housing is configured to be deformed into a flat shape,
wherein at least a portion of the support sheet is disposed between the curved shaped portion of the second area and the roller,
wherein a curvature of the curved shaped portion of the second area is decreases as the support sheet is wound around the roller, and
wherein the curvature of the curved shaped portion of the second area increases as the support sheet is unwound from the roller,
wherein the support sheet is configured to separate from the remaining portion of the second area that deformed into the flat shape and to wind around the roller as the second area is received in the housing, and
wherein the support sheet is configured to be unwound as the second area is exposed to the outside of the housing.

14. The electronic device of claim 13, wherein when the second area is received inside the housing, at least two different portions of the support sheet are disposed to overlap between an edge of the rear case and a rotation axis of the roller.

15. The electronic device of claim 13, further comprising:
a multi-joint hinge structure including a plurality of rods supporting the second area and, as the roller rotates, the multi-joint hinge structure is guided by the roller and inserted or received inside the housing or extracted to the outside of the housing,
wherein the multi-joint hinge structure is at least partially deformed to a curved shape in a position corresponding to the roller.

16. The electronic device of claim 15, wherein when the second area is exposed to the outside of the housing, the support sheet is disposed between the rear case and the multi-joint hinge structure.

17. The electronic device of claim 13, wherein:
a plurality of support sheets is arranged along a direction of a rotation axis of the roller, and
each of the plurality of support sheets extends in a direction perpendicular to the rotation axis.

18. The electronic device of claim 13, further comprising a slide plate slidably coupled to the housing, wherein the first area is mounted on the slide plate.

19. The electronic device of claim 18, wherein:
the support sheet includes a first end fixed to the roller and a second end fixed to the slide plate, and
at least a portion of the support sheet is positioned to face the second area or wind around the roller.

20. The electronic device of claim 13, further comprising:
at least one elastic member mounted on at least one of: an end of the flexible display, or an inner surface of an edge of the rear case,
wherein when at least the second area is exposed to the outside of the housing, the elastic member is positioned between the inner surface of the edge of the rear case and a surface of the flexible display.

* * * * *